United States Patent
Nakamura et al.

(10) Patent No.: US 7,462,896 B2
(45) Date of Patent: Dec. 9, 2008

(54) SEMICONDUCTOR MEMORY DEVICE AND MANUFACTURING METHOD FOR SEMICONDUCTOR MEMORY DEVICE

(75) Inventors: Takaharu Nakamura, Tokyo (JP); Tetsuhiro Maruyama, Tokyo (JP); Masao Tsujimoto, Miyazaki (JP); Ikuo Kurachi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 98 days.

(21) Appl. No.: 11/476,910

(22) Filed: Jun. 29, 2006

(65) Prior Publication Data

US 2007/0023824 A1 Feb. 1, 2007

(30) Foreign Application Priority Data

Jun. 30, 2005 (JP) .............................. 2005-190953
May 18, 2006 (JP) .............................. 2006-139327

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ..................... 257/288; 257/324; 257/350; 257/E21.17; 257/E21.304; 257/E21.278; 257/E21.293; 257/E21.324; 257/E21.435

(58) Field of Classification Search .................. 257/288, 257/296, 315, 316, 318, 319, 320, 324, 350, 257/639, 640, 760
See application file for complete search history.

(56) References Cited

U.S. PATENT DOCUMENTS

| | | | | |
|---|---|---|---|---|
| 5,061,651 A | * | 10/1991 | Ino | 438/253 |
| 5,075,745 A | * | 12/1991 | Ino | 257/306 |
| 5,391,912 A | * | 2/1995 | Horiuchi et al. | 257/588 |
| 5,768,184 A | * | 6/1998 | Hayashi et al. | 365/185.03 |
| 6,031,260 A | * | 2/2000 | Sunouchi | 257/296 |
| 6,040,995 A | | 3/2000 | Reisinger et al. | |
| 6,137,718 A | | 10/2000 | Reisinger | |
| 7,015,540 B2 | * | 3/2006 | Ishii et al. | 257/322 |

FOREIGN PATENT DOCUMENTS

JP 2004-335595 11/2004

* cited by examiner

*Primary Examiner*—David Nhu
(74) *Attorney, Agent, or Firm*—Rabin & Berdo, PC

(57) ABSTRACT

The object is simplification of a manufacturing process for nonvolatile memory by reducing additional processes for forming a charge storage structure, and downsizing of nonvolatile memory. The solution is a manufacturing method for semiconductor memory device including a process for forming sequentially a first oxide film 102, a first nitride film 103 on a semiconductor substrate 101, a process for removing the first oxide film 102 and the first nitride film 103 in an element isolating region 1010B, a process for overhanging the first nitride film 103 over the first oxide film 102 by removing the edge of the first oxide film 102 by cleaning or wet etching, a process for forming a first insulating film 105 (element isolating insulating film) so that a lower density part 105c having a lower film density than other parts thereof can be formed in the side part of the fist oxide film 102, a process for exposing the lower density part 105c, a process for forming a hole in the first insulating film 105 by eroding the lower concentration part 105c using cleaning or wet etching, and a process for forming charge storage film in the hole.

12 Claims, 14 Drawing Sheets

Fig.1
(a)
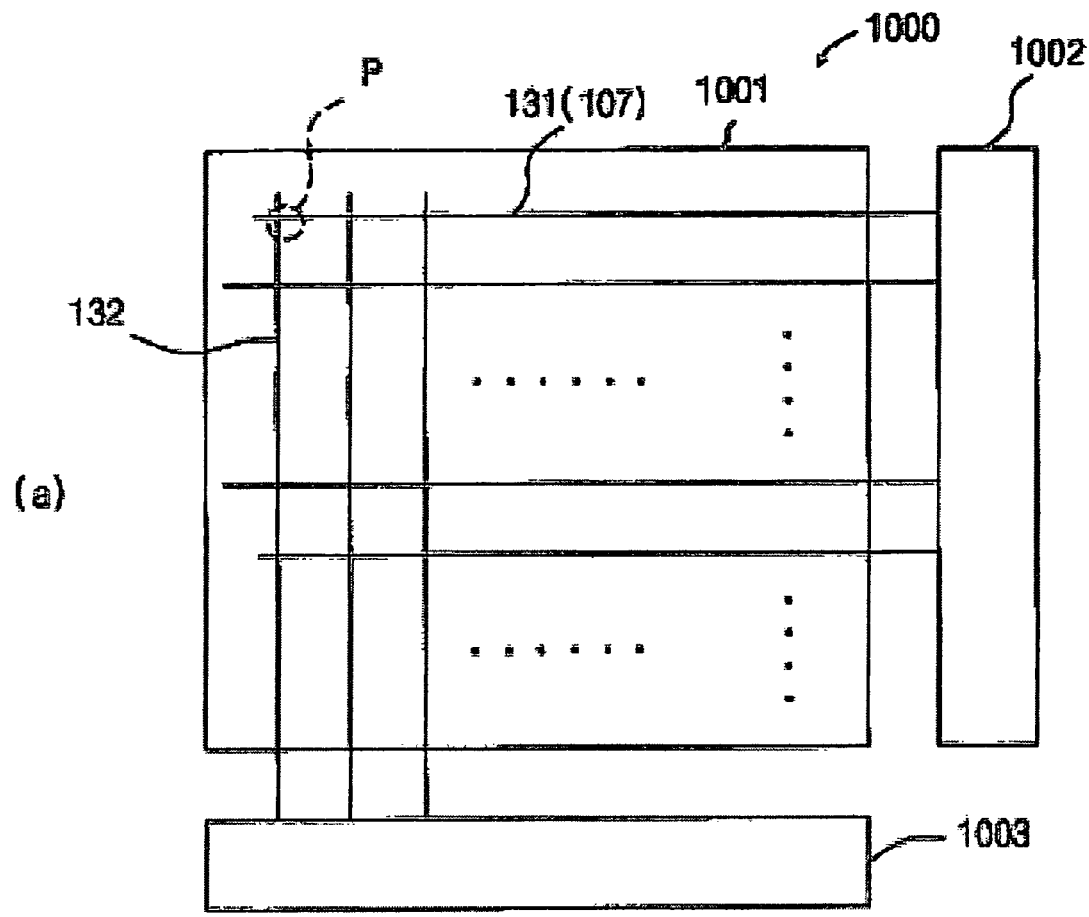
(b)
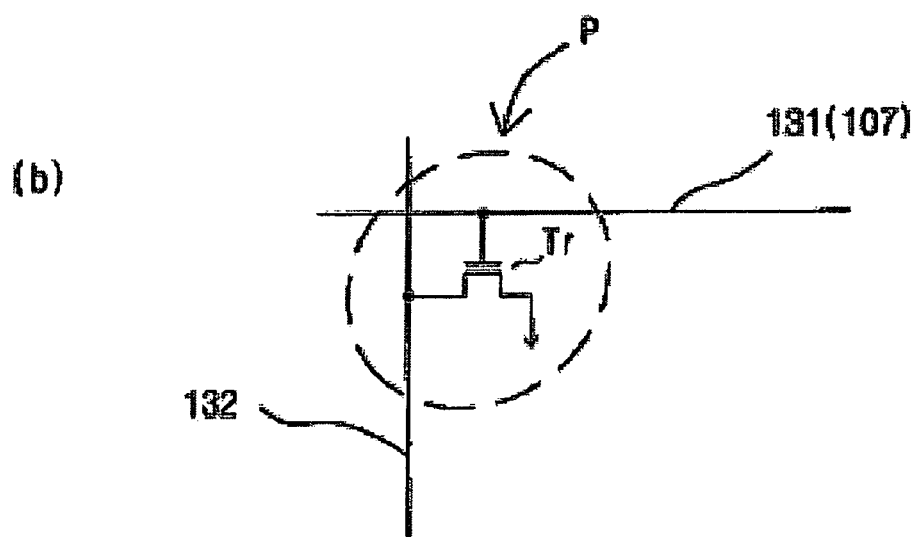

Fig.3
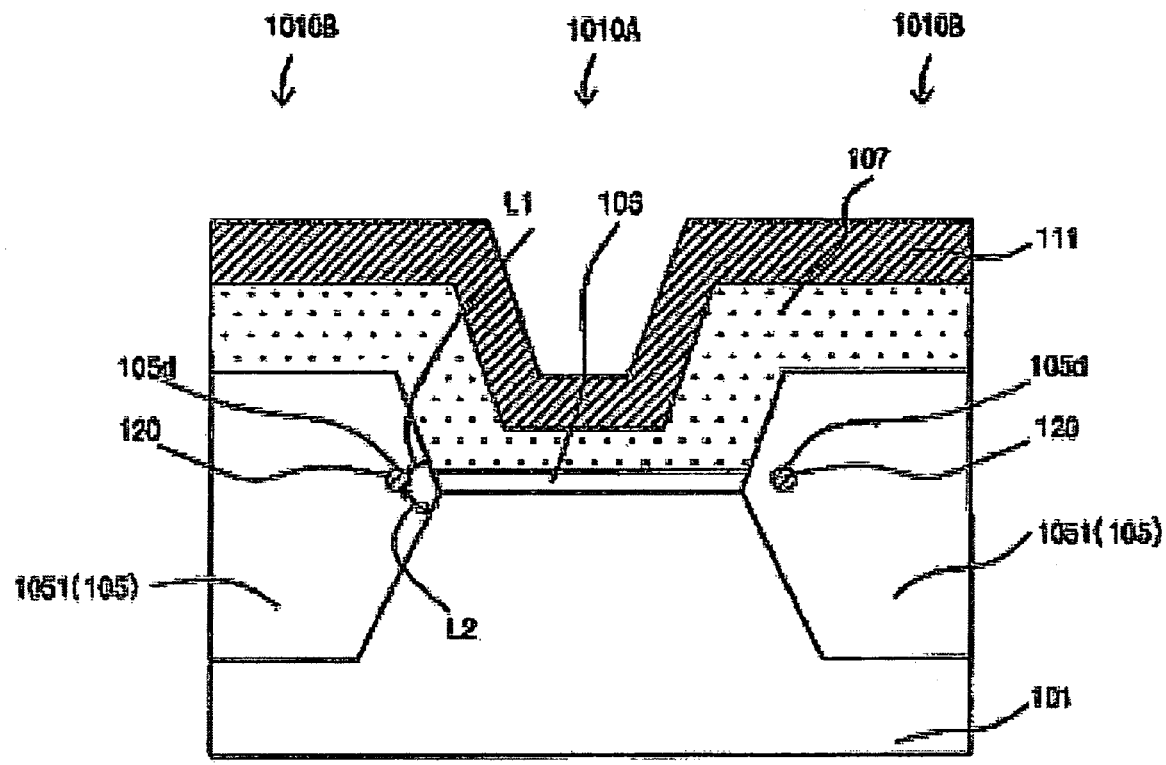
(a)
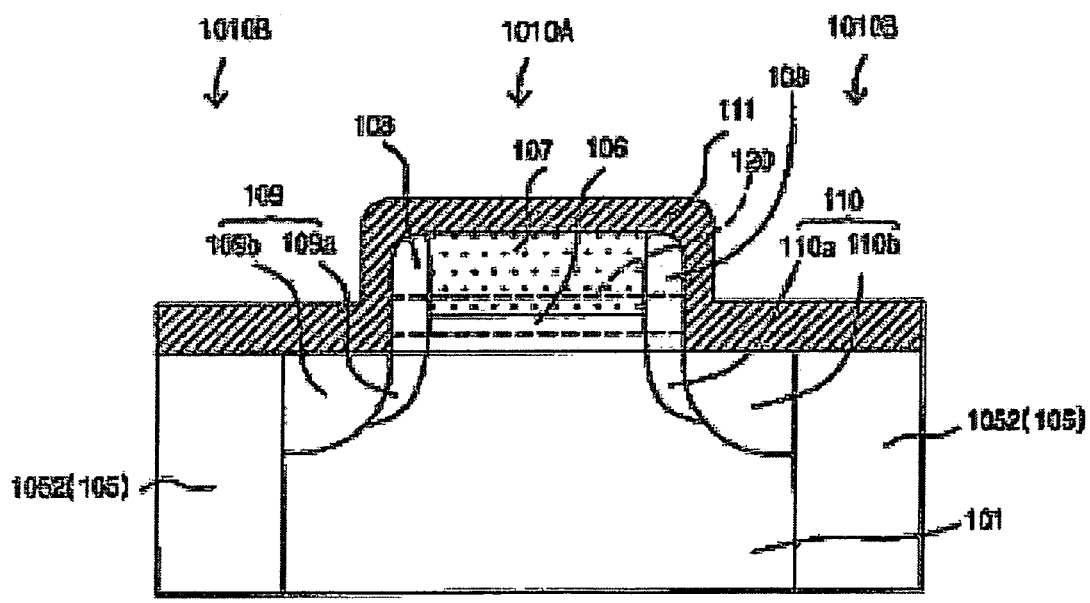
(b)

Fig.5
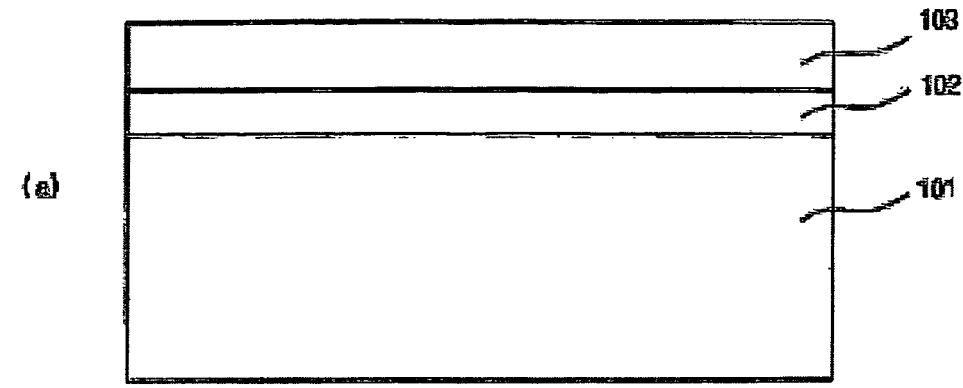
(a)
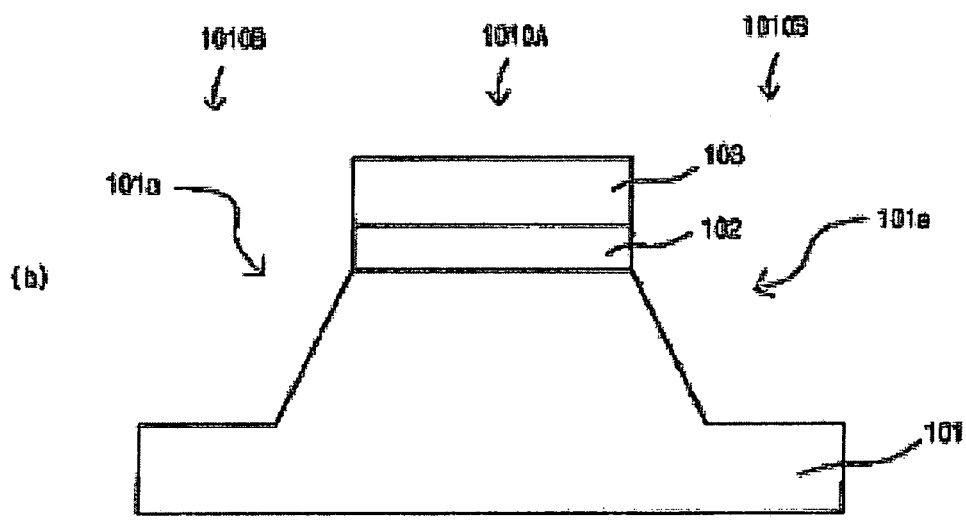
(b)
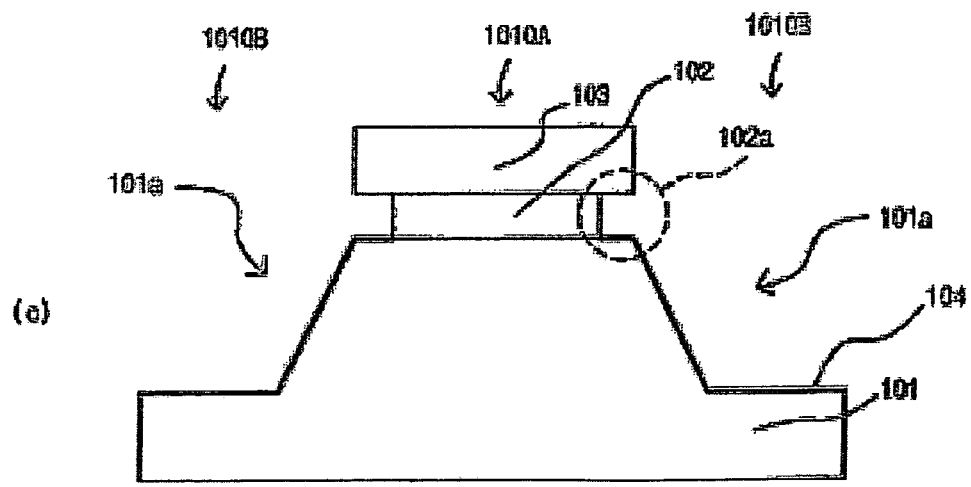
(c)

Fig.7
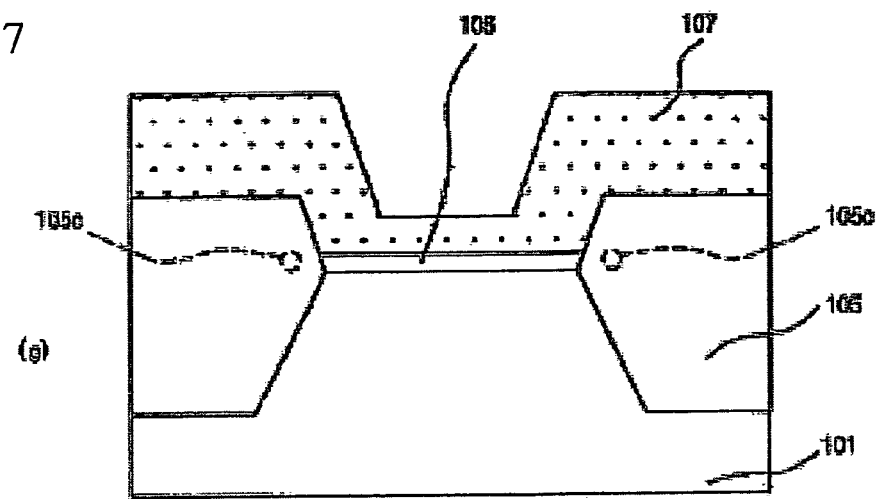
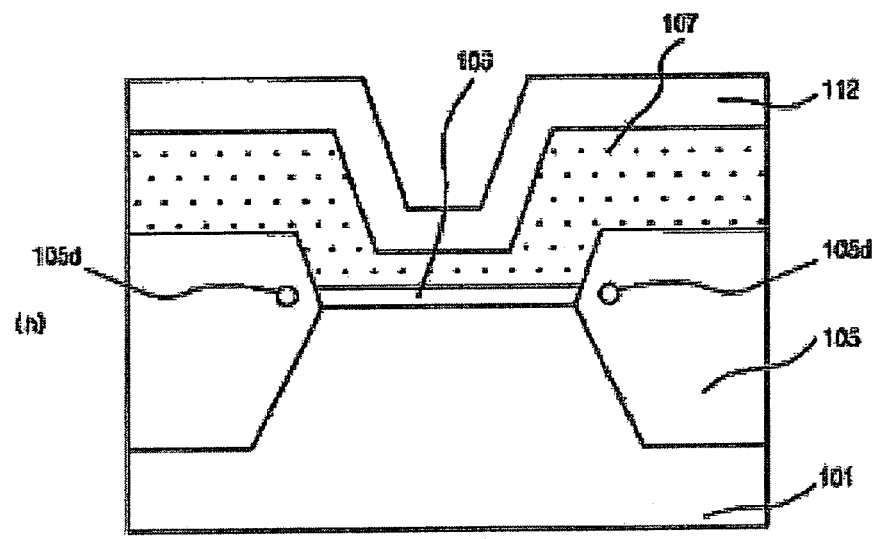
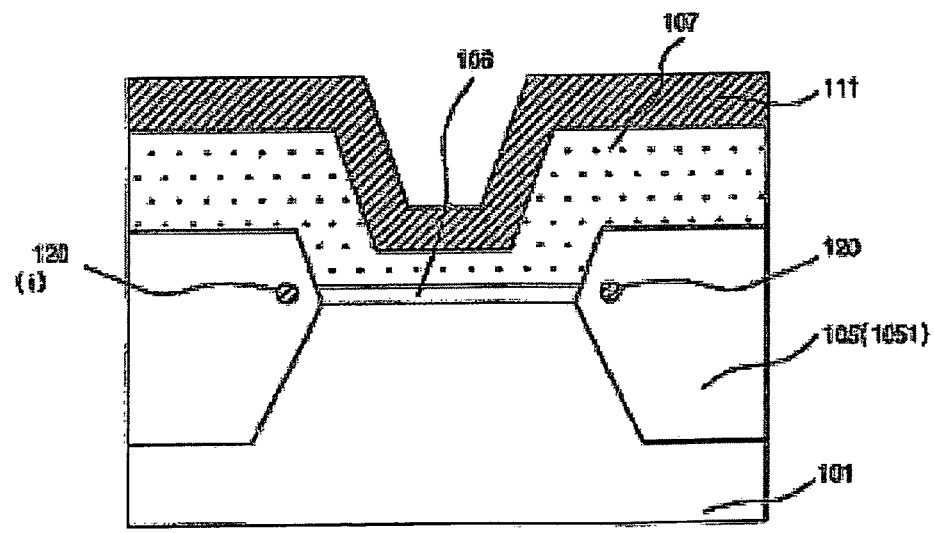

Fig.9
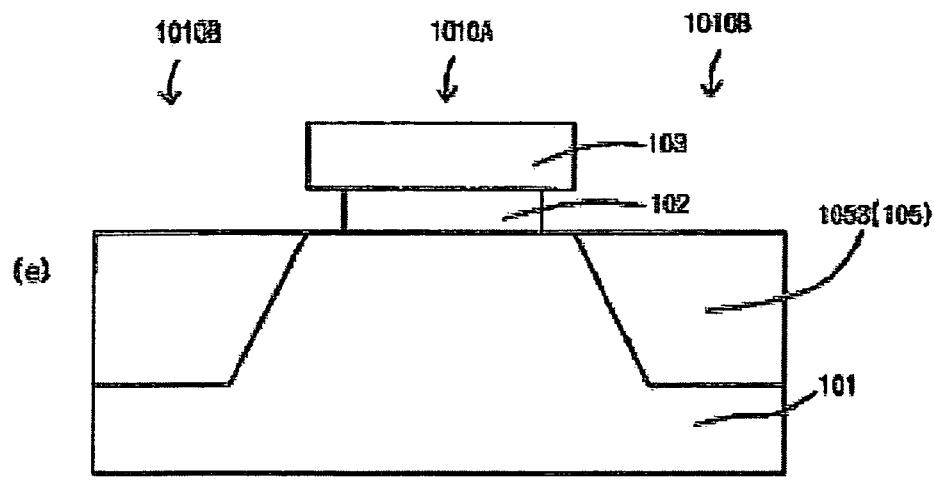
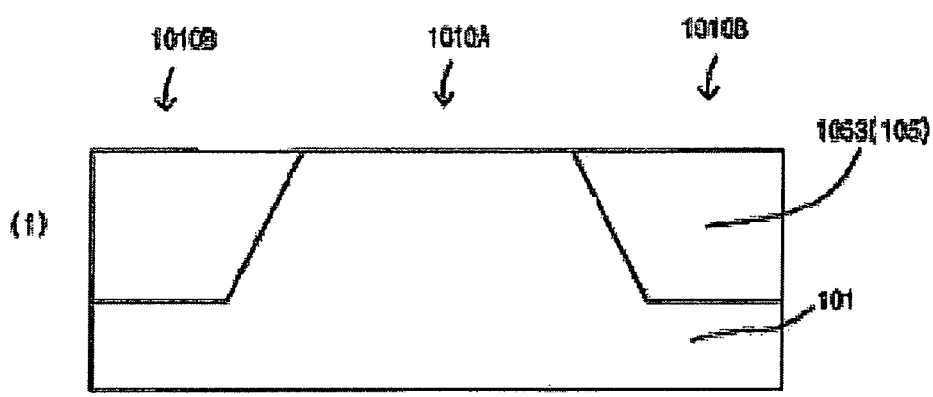
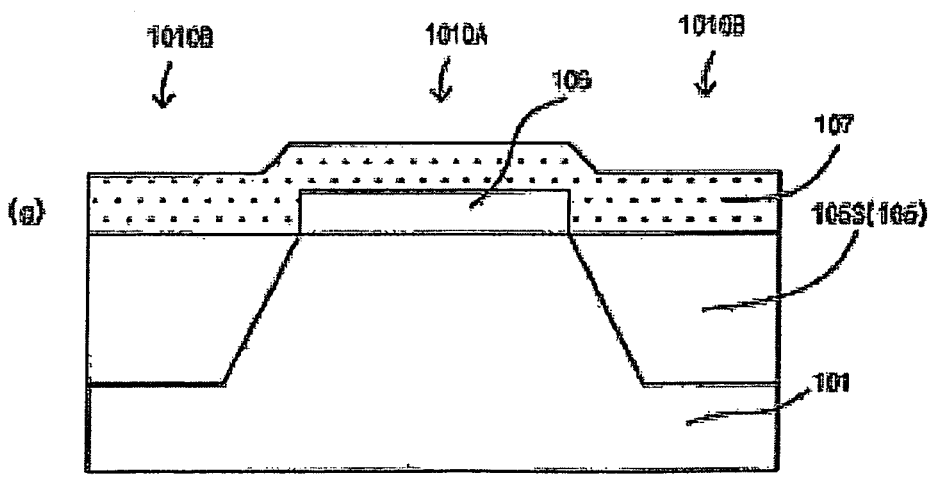

Fig.11

Case of the cell transistor formed by Pch MSOFET

| | | |
|---|---|---|
| DATA WRITE STAGE | 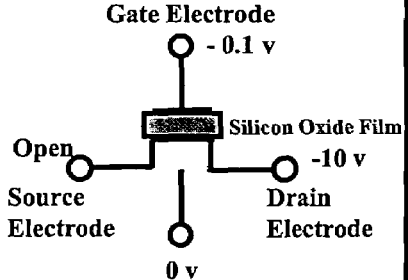 Gate Electrode −0.1 v, Silicon Oxide Film, Open Source Electrode, Drain Electrode −10 v, 0 v | In the depletion region formed beneath the gate, a hole is generated by Band-to-Band tunneling. The hole is changed to a hot hole (hot-hole-state) by the electric field within the depletion layer, and a part of the holes reaches to the silicon nitride film and is held therein. |
| DATA READ STAGE | 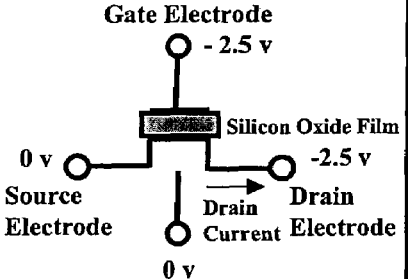 Gate Electrode −2.5 v, Silicon Oxide Film, 0 v Source Electrode, Drain Current, Drain Electrode −2.5 v, 0 v | Whether the information stored in the transistor is "0" or "1" is judged by the smaller drain current, using the apparent rising of the transistor threshold caused by plus charge of the silicon nitride film at the writing stage. That is, the drain current in the case where the silicon nitride film is charged to plus by writing is smaller than the drain current in the case where the silicon nitride film is not charged to plus. |
| DATA ERASE STAGE | 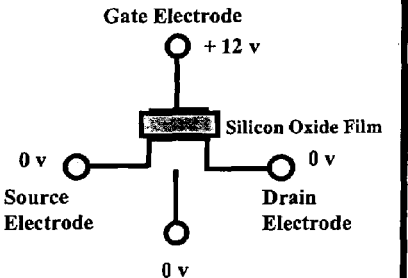 Gate Electrode +12 v, Silicon Oxide Film, 0 v Source Electrode, 0 v Drain Electrode, 0 v | The silicon oxide film is electrically neutralized by filling electrons into the silicon oxide film by Fowler-Norheim tunneling. |

Fig.12

Case of the cell transistor formed by Nch MSOFET

| | | |
|---|---|---|
| DATA WRITE STAGE | 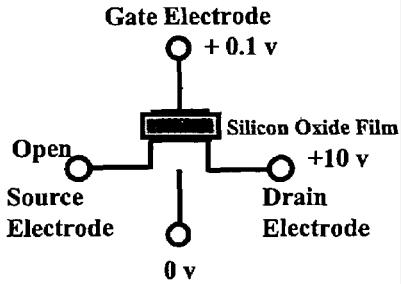 Gate Electrode +0.1 v, Silicon Oxide Film, Open Source Electrode, Drain Electrode +10 v, 0 v | In the depletion region formed beneath the gate, an electron is generated by Band-to-Band tunneling. The electron is changed to a hot electron (hot-electron-state) by the electric field within the depletion layer, and a part of the electrons reaches to the silicon nitride film and is held therein. |
| DATA READ STAGE | 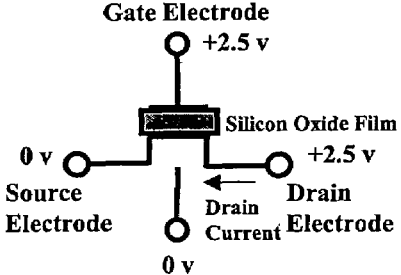 Gate Electrode +2.5 v, Silicon Oxide Film, 0 v Source Electrode, Drain Current, Drain Electrode +2.5 v, 0 v | Whether the information stored in the transistor is "0" or "1" is judged by the smaller drain current, using the apparent rising of the transistor threshold caused by minus charge of the silicon nitride film at the writing stage. That is, the drain current in the case where the silicon nitride film is charged to minus by writing is smaller than the drain current in the case where the silicon nitride film is not charged to minus. |
| DATA ERASE STAGE | 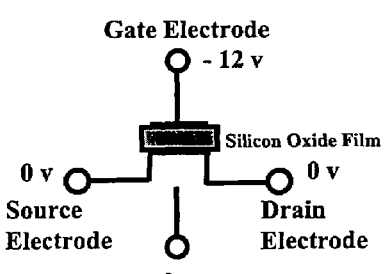 Gate Electrode -12 v, Silicon Oxide Film, 0 v Source Electrode, 0 v Drain Electrode, 0 v | The silicon oxide film is electrically neutralized by filling holes into the silicon oxide film by Fowler-Norheim tunneling. |

SEMICONDUCTOR MEMORY DEVICE AND MANUFACTURING METHOD FOR SEMICONDUCTOR MEMORY DEVICE

BACKGROUND OF THE INVENTION

The present invention relates to a semiconductor memory device and a manufacturing method for semiconductor memory device. For more details, the present invention relates to a semiconductor memory device composed of a field effect transistor having function to transfer a change of electrical charge to a change of current, and a manufacturing method for the semiconductor memory device thereof.

Conventionally, the nonvolatile semiconductor memory device fabricated by the MOSFET having the charge storage layer is commonly known. In the above semiconductor memory device, the digital bit information is stored by charging an electrical charge into the charge storage layer through the insulation film and the information is read out based on the change of conductance of the MOSFET corresponding to the change of electrical charge thereof. For example, the MONOS (Metal-Oxide-Nitride-Oxide-Semiconductor) type semiconductor memory device is fabricated by the MOSFET using the silicon nitride film thereof as the charge storage layer and is researched more actively from the possibility for low-voltage writing information or low-voltage erasing information than the semiconductor device using floating gates formed by poly silicon.

In the patent document 1 and 2, there is a description of the NOMOS type semiconductor memory device fabricated by the MOSFET having the electrical charging function in the gate insulation film. The above semiconductor memory device includes the semiconductor substrate having the source region and the drain region, the gate insulation film formed by the multi-layer structure between the source region and the drain region on the semiconductor substrate, and the gate electrode formed on the gate insulation film. The above insulation film has the structure, generally referred to as "ONO (Oxide Nitride Oxide)" structure, having the sandwiched silicon nitride film by the first silicon oxide film and the second silicon oxide film. In the semiconductor memory device having the above structure, the digital bit information is stored as follows. The electrical charge is put from the channel layer formed between the source region and the drain region into the silicon nitride film through the first silicon oxide film by adjusting voltage of the gate electrode, the source region, the drain region, and the semiconductor substrate, and the electrical charge being put thereto is stored in the trap energy level generated in the interface between the silicon nitride film and the first silicon oxide film or in the silicon nitride film.

Additionally, in the patent document 3, there is a description of the semiconductor memory device forming the bar of charge storage part along the direction of the gate width independently from the both side walls of the gate insulation film of the MOSFET. The above semiconductor memory device includes the semiconductor substrate having the source region and the drain region, the gate insulation film and the gate electrode formed on the semiconductor substrate, and the bar of charge storage part placed in the side of the gate insulation film. The charge storage part consists of the bar of carbonaceous matter film formed as the charge storage layer and the tube of insulator surrounding the carbonaceous matter thereof. In the above semiconductor memory device, the digital bit information is stored as follows The electrical charge is put from the channel layer formed between the source region and the drain region into the carbonaceous matter through the first silicon oxide film by adjusting voltage of the gate electrode, the source region, the drain region, and the semiconductor substrate, and then the electrical charge being put thereto is confined in the trap energy level generated in the interface between the carbonaceous matter and insulator or in the carbonaceous matter. The object of the above semiconductor is reducing the thickness of the gate insulation film without losing enough memory function by separating the charge storage part from the gate insulation film and by separating memory function of the charge storage part from transistor function of the gate insulation film.

[Patent document 1] Patent description of U.S. Pat. No. 6,137,718

[Patent document 2] Patent description of U.S. Pat. No. 6,049,995

[Patent document 3] Japanese Patent Journal No. 2004-335595

SUMMARY OF THE INVENTION

Generally, the semiconductor memory device consists of a memory array configured to place a plural of cell transistors of the above-mentioned semiconductor memory element in matrix arrangement, and peripheral circuits thereof. The peripheral circuits including driving circuits, etc. to write, read, and erase the information in the memory array; are configured by CMOS circuits. In the above mentioned-conventional semiconductor memory device, since many additional processes is necessary to configure the peripheral circuits by the CMOS circuit on the same substrate as the memory cell, the cost rising for the semiconductor memory device becomes inevitable.

Furthermore, in the semiconductor memory element described in the patent document 1, the gate insulation film needs to have a three-layer structure of the ONO structure for a charge storage function of the gate insulation film, therefore the reducing the thickness of the gate insulation film becomes difficult.

In the semiconductor memory device described in the paten document 3, the process forming the charge storage part having the structure for surrounding the bar of carbonaceous matter by the insulator needs to be added to the normal CMOS process, therefore the cost rise become inevitable. Additionally, in the case where the charge storage part is formed on the both sides of the gate electrode along the gate width direction independently from the gate electrode, since the distance between the gate electrodes needs to increase for wider margin of the process, the miniaturization of semiconductor memory device could be blocked.

Therefore, the object of the invention is solving the above mentioned problem.

A semiconductor memory device according to the present invention includes a semiconductor substrate, a first insulation film, a first infusion region, a second infusion region, a gate insulation film, a gate electrode, and a charge storage part. The semiconductor substrate has an element forming region and an element isolating region. The first insulation film is formed in the above element isolating region as a element isolating insulation film. The first infusion region and the second infusion region are formed in the element forming region of the above semiconductor substrate. The gate insulation film is formed between the above first infusion region and the above second infusion region in the above element forming region of the above semiconductor substrate. The gate electrode is formed on the above gate insulation film. The charge storage part is formed in the above first insulation film.

A manufacturing method for semiconductor memory device includes a process for preparing a semiconductor substrate, a process for forming sequentially a first oxide film and a first nitride film, a process for removing the above first oxide film and the above nitride film in the above element isolating region and forming a concavity part in the above semiconductor substrate in the above element forming region, a process for removing the edge of the above first oxide film by cleaning or wet etching and making the above nitride film hung over the above first oxide film in the above element forming region, a process for producing a first insulation film so that the lower density part having lower density film of the side of the above oxide film than other part thereof can be formed, a process for planarizing the above insulation film to the extent that the above nitride film becomes exposed, a process for exposing the surface of the above semiconductor substrate in the above element forming region by removing the first oxide film and the first nitride film, a process for forming a gate insulation film on the exposed surface of the semiconductor substrate, a process for forming a gate electrode on the above gate insulation film and the above first insulation film, a process for forming a first infusion region and a second infusion region at the both sides of the above gate insulation film on the above semiconductor substrate, a process for exposing the above lower density part by removing the above insulation film being not covered by the above gate electrode to the given extent, a process for forming a hole in the above first insulation film by eroding the above lower density part using cleaning or wet etching, and a process for forming the above charge storage film in the above holes.

The semiconductor memory device according to the present invention can provide a transistor with a charge storage function without enlargement of the transistor composing the memory element.

According to the manufacturing method for semiconductor memory element of the present invention, since the first nitride film is hanged over the first oxide film, the first insulation film including the lower density part having the lower density at the side of the first oxide film than other part thereof can be formed when the first insulation film is formed. Additionally, the holes can be formed in the first insulation film by removing selectively the lower density part using cleaning or wet etching after the lower density part is exposed to the side of the first part including the covered part by the gate electrode. Subsequently, the charge storage function can be provided the transistor by building the charge storage film in the hole.

The above mentioned etching can be conducted by changing the concentration of the same chemical as in the normal cleaning process, and virtually any process needs to be added. Furthermore, the formation of the charge storage film can be done without any additional process by using the silicon nitride film as the charge storage film after building the above silicon nitride film for planarizing the interlayer film in the hole. Consequently, in the above manufacturing process, the charge storage function can be provided the transistor by adding almost no special process for forming the charge storage film to the normal CMOS manufacturing process. Therefore, the manufacturing process for semiconductor memory device can be simplified and the cost down can be achieved. Additionally, the holes composing the charge storage film are not formed by any micro fabrication technology, such as photolithography, etching, etc., and are formed by infiltrating the chemical into the lower density part thereof using the etching rate difference corresponding to the film density difference and by eroding the lower density part rapidly using capillary phenomenon therein. Therefore, the holes thereof can be formed independently from each generation of micro fabrication technology. Consequently, the memory element can be miniaturized by miniaturization of the charge storage film, and the down sizing of the semiconductor memory device can be achieved.

Additionally, since the charge storage film is built in the first insulation film as a element isolating insulation film, there is no influence to the size of the memory element (transistor) by forming the charge storage film, and then the memory element can be formed in the minimum size of the micro fabrication process.

BRIEF DESCRIPTION OF THE DRAWINGS

FIG. 1: A general top-view diagram showing a layout of a semiconductor memory device in accordance with the present invention.

FIG. 3: A cross section diagram of a part from a memory cell array of a semiconductor memory device in accordance with the present invention, along the line of A-A' and B-B' of FIG. 2.

FIG. 5: A diagram showing a manufacturing process for a memory cell array of a semiconductor memory device in accordance with the present invention.

FIG. 7: A diagram showing a manufacturing process for a memory cell array of a semiconductor memory device in accordance with the present invention.

FIG. 9: A diagram showing a manufacturing process for a peripheral circuit region of a semiconductor memory device in accordance with the present invention.

FIG. 11: An explanatory diagram of the voltage given to the terminals of the cell transistor when the information is written, read, and erased in the case where cell transistor is a pch-MOSFET, and the operational principle of writing, reading, and erasing thereof.

FIG. 12: An explanatory diagram of the voltage given to the terminals of the cell transistor when the information is written, read, and erased in the case where cell transistor is a nch-MOSFET, and the operational principle of writing, reading, and erasing thereof.

THE DETAILED DESCRIPTION OF THE PREFRRED EMBODIMENTS

First Embodiment

A semiconductor memory device according to the first embodiment of the invention includes a memory cell array 1000 consisting of nonvolatile memory element, a ward driver 1002 for driving the memory cell array 1000, and a data driver 1003, as shown in FIG. 1.

A memory cell array 1000 includes a word line 131, a bit line 132 placed to cross the word line 131, and a plural of memory cells P formed in the intersection of the bit line 132 and the word line 131. Each memory cell includes a cell transistor explained below and consists of a MOSFET having the charge storage function.

The word line 131 is formed with a gate electrode 107 of the cell transistor Tr and a plural of the cell transistors are placed in parallel. The word line 131 is connected to a word driver 1002 and provided with a control signal (a gate voltage) from the word driver 1002. A plural of the bit lines 132 are placed to be crossed the word line 132, and are connected to the drain electrode of the cell transistor Tr. The bit line 132 being connected to the data driver 1003 provides the cell transistor with a data signal (a drain voltage) from the data driver 1003. The bit line 132 provides a data driver 1003 with the drain current of the cell transistor Tr when information stored in the cell transistor is read.

Figure 2:
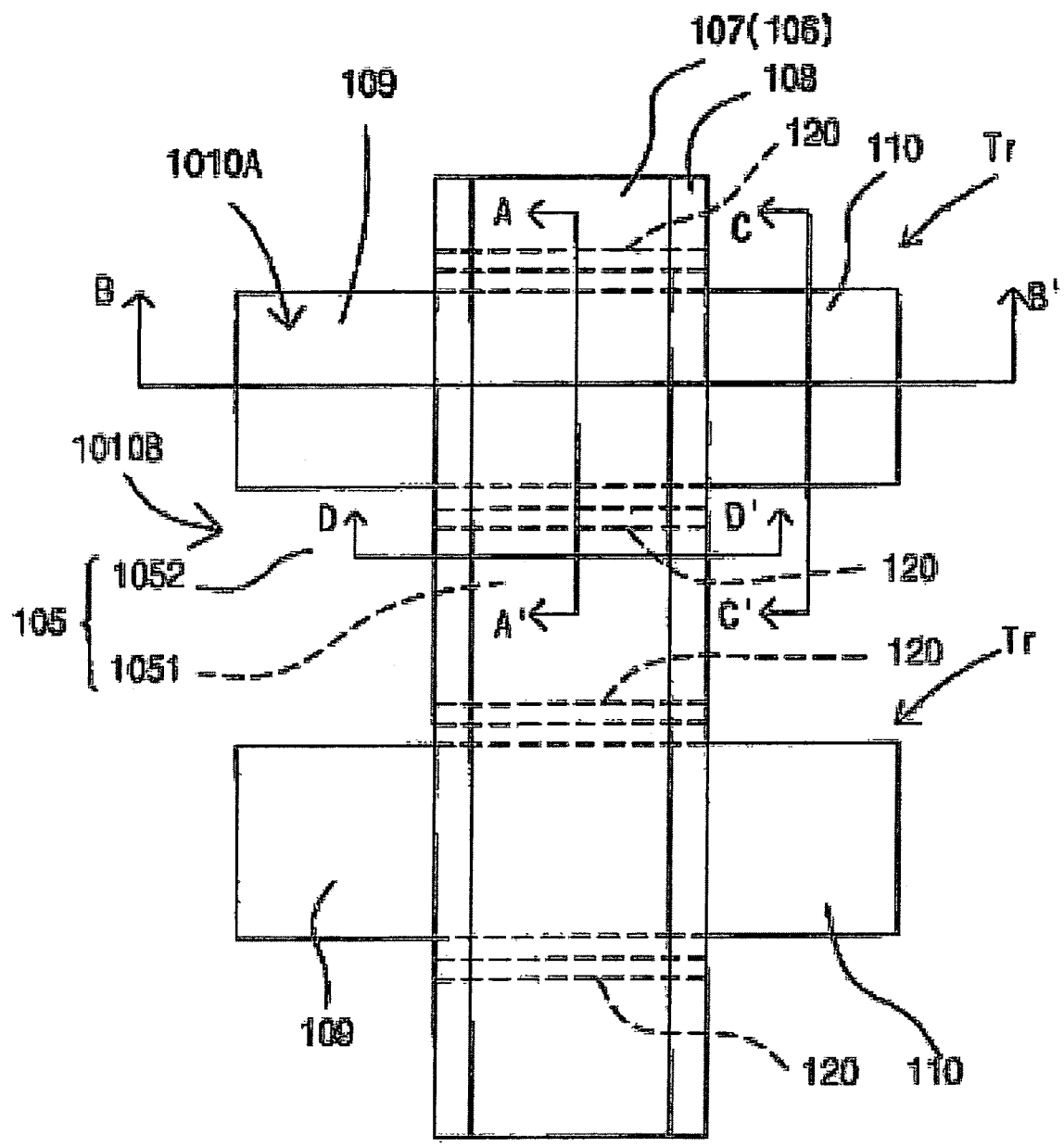
FIG. 2: A top-view diagram of an extracted part from a memory cell array of a semiconductor memory device in accordance with the present invention.
Figure 4:
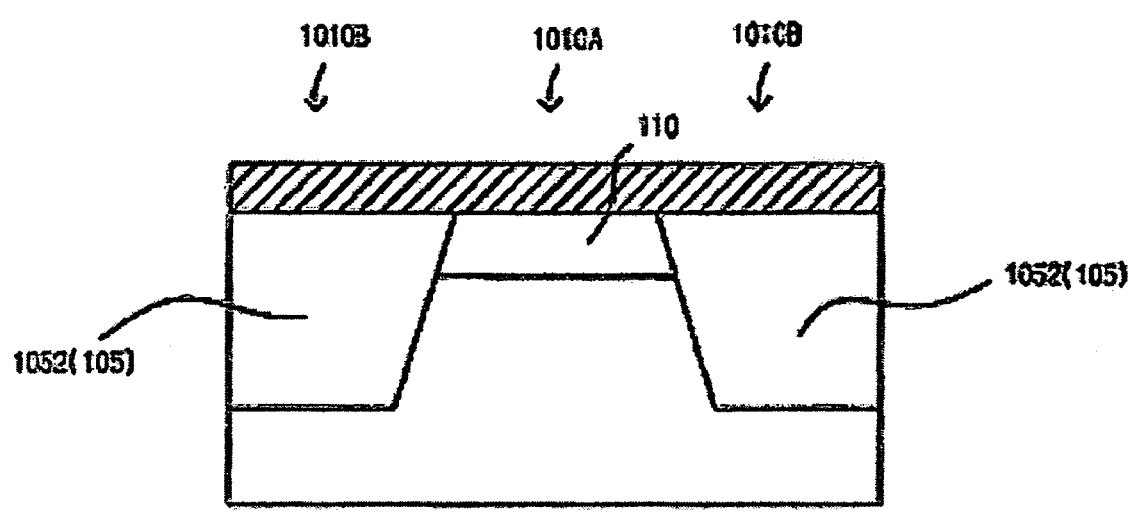
FIG. 4: A cross section diagram of a part from a memory cell array of a semiconductor memory device in accordance with the present invention, along the line of C-C' of FIG. 2.

FIG. 2 is a general top-view diagram showing a part of the cell transistor Tr of the memory cell array 1001. FIG. 3(A) is a cross section diagram along the line of A-A' of FIG. 2. FIG. 3(B) is a cross section diagram along the line of B-B' of FIG. 2. FIG. 4 is a cross section diagram along the line of C-C' of FIG. 2.

The cell transistor Tr is formed on a semiconductor substrate 101, as shown FIG. 2 or FIG. 4. At the same time, a peripheral circuits including the word driver 1002 and the data driver 1003 are formed on the semiconductor substrate 101 as CMOS circuits.

The semiconductor substrate 101 is separated into an element isolating region 1010B (referred to as "filed region", too) and a element forming region 1010A (referred to as "active region", too) by an element isolating insulation film 105.

In the element isolating region 1010A, a source region 109 and a drain region 110 are formed at each cell transistor Tr on the semiconductor substrate 101. A gate insulation film 106 is formed in the region between the source region 109 and the drain region 110 per each cell transistor Tr on the semiconductor substrate 101, and a gate electrode 107 is formed on the gate insulation film 106. Additionally, the vicinity of the surface between the source region 109 and the drain region 110 of the semiconductor substrate 101 is a channel region for generating a channel layer when the cell transistor Tr is active. The gate electrode 107 is formed as the common word line 131 for the cell transistors Tr placed in the same line of the memory cell 1001 shown in FIG. 1. Sidewalls 108 are formed along the gate electrode 107 (word line 131) on the both sides of the walls of the gate electrode 107 (word line 131).

The gate insulation film 106 is formed by silicon oxide film, silicon nitride film, or other kind of insulation film. The gate electrode 107 (word line 131) is formed as a wiring layer formed by poly-crystal silicon or amorphous silicon. The gate electrode 107 (word line 131) can be formed as a wiring layer including a layer of poly-crystal silicon or amorphous silicon and a layer of silicon including a high-melting-point metal.

The source region 109 includes a lower concentration diffusion region 109a (generally referred to as LDD region: abbreviation of "lightly doped diffusion") formed under the sidewall 108 of the source region 109 side and a higher concentration diffusion region 109b formed outside the sidewall 108 of the source region 109 side, as shown FIG. 2 and FIG. 3(B). The drain region 110 includes a lower concentration diffusion region 110a (generally referred to as LDD region) formed under the sidewall 108 of the drain region 110 side and a higher concentration diffusion region 110b formed outside the sidewall 108 of the drain region 110 side, as shown FIG. 2 and FIG. 3(B).

The element isolating insulation film 105 is an insulation film formed by silicon oxide film or silicon nitride film, etc. At the same time, the element isolating film 105 can be a composite film, provided that the composite film having a function to insulate electrically each cell transistor Tr formed in the element forming region 1010A against the semiconductor substrate 101.

The element isolating film 105 consists of a first part 1051 shown in FIG. 2, FIG. 3 (B), and FIG. 4, and a second part 1052 shown in FIG. 2, FIG. 3(B), and FIG. 4. The first part 1051 is the part covered with the gate electrode 107 (word line 131) and the both sides of the sidewall 108 and is formed in a projected shape from the surface of the semiconductor substrate 101 of the element isolating region 1010A, as shown in FIG. 2 and FIG. 3(A). The second part 1052 is the part not covered with the both sides of the gate electrode 107 (word line 131) and the sidewall 108, and is formed at the approximately same height as the surface of the semiconductor surface 101 of the element isolating region 1010A, as shown in FIG. 2, FIG. 3(B), and FIG. 4. That is, the second part 1052 is formed at the lower height than the first part 1051.

Additionally, in the peripheral circuit region except the memory cell array 1001, the element isolating insulation 105 is formed at the approximately same height as the surface of the semiconductor substrate 101 of the element isolating region 1010A, as described later.

In the first embodiment, the cell transistor Tr has a structure including the sidewall 108, however, some of the cell transistor Tr has a structure not including the sidewall 108. In the case of the transistor Tr not including the sidewall 108, the first part 1051 and the second part 1052 of the element isolating insulating film 105 are formed as follows. The first part 1051 is the part covered with the gate electrode 107 (word line 131), and the part covered with the gate electrode 107 (word line 131) is formed in a projected shape from the surface of the semiconductor substrate 101 in the element forming region 1010A, while the second part 1052 is a part not covered with the gate electrode 107 (word line 131), and the part not covered with the gate electrode 107 (word line 131) is formed at a approximately same height as the height of the surface of the semiconductor substrate 101 in the element forming region 1010A. In the above case, the first part 1051 includes only the element isolating insulating film 105 covered with the gate electrode 107 (word line 131).

As explained before, the first part 1051 is formed at a higher height than the second part 1052, and exposes the sides thereof to the source region 109 side and the drain region 110 side. The side of the first part 1051 exposed to the source region 109 side (source side region) and the side of the first part 1051 exposed to the drain region 110 side (drain side region) are facing each other. In the first part 1051, a hole 105$d$ penetrating from the side face of the source side and the side face of the drain side is formed, and the silicon nitride film 120 is filled in the hole 105$d$ as a charge storage film. The hole 105$d$ is formed, for example, in a cylindrical shape having a circular cross section, however, the shape of the cross section thereof is not limited to a circular shape. As described later, the hole 105$d$ is formed by infiltrating the chemicals into the lower density part 105$c$ having low film density with the help of the film density difference of the element isolating insulating film 105 at the cleaning process or the etching process, and by rapid erosion caused by capillary phenomenon. The hole 105$d$ has a diameter of less than 0.05 um.

The silicon nitride film 120 formed in a bar shape penetrating from the side face of the source side of the first part 1051 of the element isolating insulating film 105 to the side face of the drain side of the first part 1051 thereof. That is, the silicon film 120 is formed in the direction from the side face of the source side to the side face of the drain side, in other words, in direction of the gate width or the channel length. Per one cell transistor Tr, two of the silicon nitride films 120 are formed in the first part 1051 of both sides of the gate electrode 107 (word line 131). That is, two silicon nitride films 120 are formed in one transistor cell Tr.

As shown in FIG. 3 or FIG. 4, the whole surface of the element forming region 1010A or the element isolating region 1010B, in other words, on the gate electrode 107, the source region 109, the drain region 110, and the second part 1052 of the element isolating insulating film 105, the silicon nitride film 111 is formed. The above silicon nitride film 111 is used as a stopper film for etching a contact hole at the upper layer wiring process. The silicon nitride film 120 used for the charge storage film is formed by infiltrating of silicon nitride into the hole 105$d$ at the forming process of the silicon nitride film 111, and the silicon nitride film 120 is formed with the same material as the silicon nitride film 111.

As explained before, since the silicon nitride film 120 is filled in the hole 105$d$ penetrating from the side face of the source side to the side face of the drain side in the first part 1051, the cross section shape of silicon nitride 120 depends on the cross section shape of the hole 105$d$. In the case where the cross section shape of the hole 105$d$ is circular, the cross section shape of the silicon nitride film 120 is circular. However, the cross section shape of the silicon nitride film 120 is not limited to a special shape. In some manufacturing process, in the case where the cross section of the hole 105$d$ is polygonal, such as rectangular, etc., the cross section of the silicon nitride 120 can be polygonal. As described before, since the silicon nitride film 120 is filled in the hole 105$d$ having a diameter of less than 0.05 um, the silicon film 120 has a diameter of less than 0.05 um.

As shown in FIG. 3(A), The silicon nitride film 129 is separated a distance L1 away from the gate electrode 107 (word 131) by the element isolating insulating film 105, and is separated a distance L2 away from the channel region of the semiconductor substrate 101 by the element isolating insulating film 105. Additionally, a part of the source region 109 side of the silicon nitride film 120 is formed to overlap the source region 109, a part of the drain region 110 side of the silicon nitride film 120 is formed to overlap the drain region 110, as shown in FIG. 3(B). To be more detailed, the part of the source region 109 side of the silicon nitride film 120 mainly overlaps the lower concentration diffusion region 109$b$ of the source region 109, an the part of the drain region 110 side of the silicon nitride film 120 mainly overlaps the lower concentration diffusion region 110$b$ of the drain region 110.

For the description hereof, the silicon nitride film is taken as an example of the charge storage film, however, when the charge storage film can be filled in the hole 105$d$ at lowered pressure, the charge storage film thereof is not limited to a silicon nitride film. For example, in the case where the element isolating insulating film 105 formed by the silicon nitride film, a silicon film or a conductive film can be used for the charge storage film filled in the hole 105$d$.

In non volatile memory structures, since a charge storage film for storing a electrical charge, such as silicon nitride film, etc., is commonly formed by a micro processing technology, for example, photolithography or etching, the minimum pattern size of the charge storage film is limited by the possible minimum size according to the used generation of micro fabricating technology. In the case where the I-line light (wave length: 365 nm) is used for the exposure, the physical limit of the minimum size is around 0.3 um, and in the case where KrF laser is used for the exposure, the limit thereof is around 0.15 um.

On the contrary, according to the present invention, the silicon nitride film 120 for the charge storage film is formed not by a micro fabricating technology, such as photolithography or etching, by infiltrating rapidly the chemical into the lower density part 105$c$ of the element isolating insulating film 105 with the help of the film density difference of the element isolating insulating film 105 and erode rapidly the element isolating insulating film 105, therefore, the charge storage film can be formed independently from generations of micro fabrication technology.

Additionally, the cell transistor Tr is not enlarged by forming the silicon nitride film 120 for filing the silicon nitride film 120 into the element isolating insulating film 105, that is, filling the silicon nitride film 120 produced in the common CMOS production process in to the element isolating insulating film 105. In other words, when the silicon nitride film 120 is built in the MOSFET, the MOSFET of the minimum size according to the presently available micro fabrication technology having the charge storage function can be produced, without increasing the size of thereof by the process for the silicon nitride film 120.

According to the present invention, as explained later, the silicon nitride film 120 is formed not principally by the process added for the purpose of formation of the silicon nitride film 120, but collaterally by the process for the common CMOS structure, therefore, the non volatile memory process can be added to the common CMOS process almost without an additional process. To be more specific, an element isolating insulating film, such as silicon oxide film, etc., commonly used for forming the element isolating insulating region 1010B can be directly applied to the insulating film for relaying the charge at the writing stage, as well as the insulating film for insulate the charge storage film (silicon nitride 120) and the gate electrode 107 (word line 108).

Additionally, a silicon nitride film used for a stopper film for etching a contact hole in a process for forming an upper layer wiring can be directly used for the silicon nitride film 120 for trapping and holding the charge. Consequently, the process thereof has the strong affinity with the process for the common CMOS structure.

The non volatile memory cell structure according to the present invention has a non volatile memory cell structure based on the method for judging whether the information held in the memory cell is "0" or "1" from reading the information by detecting the threshold voltage difference after changing the threshold voltage of the cell transistor Tr by writing the information by filling the charge into the silicon nitride film 120 used for the charge storage film.

A writing operation, a reading operation, and an erasing according to the present invention will be explained specifically as below.

Case of the pch Cell Transistor Tr:

FIG. 11 is a explanatory diagram of a voltage given to each terminal of a cell transistor Tr and a writing principal at the writing stage in the case of pch cell transistor Tr.

Writing Operation:

The information writing to the memory cell P is done by generating the tunneling current referred to as Band-to Band tunneling. A voltage difference of around 10v is given between the gate electrode 107 and the drain electrode of the cell transistor Tr to arise the Band-to-Band tunneling. To be specifically, as shown in FIG. 11, the gate electrode 107 is set to −0.1v, the drain electrode (drain region 110) is set to −10v, the source electrode is set to open, the semiconductor 101 or the well is set to the ground voltage (0v).

Consequently, the electron tunneling from the valence band to conduction band beneath the gate electrode 107 arises, therefore, the hole is generated. The hole thereof is changed to a hot hole caused by the electric field within the depletion layer, and a part of the holes goes through the element isolating insulating film 105 (LI part of FIG. 3) to the silicon nitride film 120. As explained before, the information is written by charging the silicon nitride film 120 to plus by filling the hole into the silicon nitride film 120.

The hole reached to the silicon nitride 120 is held in the tarp level on the interface of the silicon nitride 120 or in the silicon nitride film 120, subsequently the position thereof can not be changed easily unless a erasing voltage is given from the outside and the silicon nitride film 120 is steadily being charged to plus.

Reading Operation:

The reading operation from the memory cell P is done using the apparent uprising of the threshold voltage of the pch cell transistor Tr caused by plus charging of the silicon nitride film 120 by the writing operation. That is, whether the information held in the cell transistor Tr is "0" or "1" is judged using the smaller drain current value of the threshold voltage of the cell transistor Tr of the silicon nitride film 120 charged to plus by the writing operation, compared with the threshold voltage of the cell transistor Tr of the silicon nitride film 120 not charged to plus because of no writing operation. To be specifically, whether the information held in the cell transistor Tr is "0" or "1" is judged by comparing the drain current read from the pch cell transistor Tr of the memory cell P with the threshold voltage of the cell transistor Tr of the memory cell P of the silicon nitride film 120 not charged to plus (that is, no writing).

In the case where the silicon nitride film 120 is charged to plus, the reason for the apparent uprising of the threshold voltage of the cell transistor Tr is that the plus electric field enters into the channel region (between the source region 109 and the drain region 110) in the vicinity of the silicon nitride film 120 and then the potential energy of the channel region rises. When the potential energy of the channel region rises, in the case of the pch cell transistor Tr, the potential energy becomes high as a carrier of the hole, then a inversion layer becomes more difficult to be generated, compared with the channel region of the silicon nitride film 120 not charged to plus, even when the same gate voltage is provided. Consequently, the threshold voltage of the cell transistor Tr of the silicon nitride film 120 filled with the hole becomes higher than the one of the silicon nitride film 120 not filled with the hole.

To be specifically, as shown in FIG. 11, the gate electrode 107 is set to −2.5v, the drain electrode is set to −2.5v, the source electrode is set to the ground voltage (0v), and the semiconductor substrate 101 or well is set ground voltage (0v). Consequently, a inversion layer is generated on the surface of the channel region, and the drain current flows between the drain region 110 and the source region 109. Whether the information is "0" or "1" is judged by comparing the detected drain current thereof with the drain current of the cell transistor Tr not receiving the writing operation.

Erasing Operation:

The information written in the memory cell P, that is the hole filled into the silicon nitride film 120 is erased by changing the cell transistor Tr back to the initial state by the electrical neutralization of filling the electron into the silicon nitride film 120 by generating the FN (Foweler-Norheim) tunnel current.

To be specific, as shown in FIG. 11, the gate electrode 107 is set to +12v, the drain electrode is set to the ground voltage (0v), the source electrode is set to the ground voltage (ov), the semiconductor substrate 101 or the well is set to the ground voltage (ov). Therefore, the FN tunnel current flows from the silicon nitride film 120 to the drain region 110, then the electron is filled into the silicon nitride film 120 and the silicon nitride film 120 is electrically neutralized.

Case of the nch Cell Transistor Tr:

FIG. 12 is a view of an explanatory diagram of the voltage given to each terminal of the cell transistor Tr at the writing stage of the information and the writing principal.

Writing Operation:

Writing of the information to the memory cell P is done by generating the tunneling current referred to as the Band-to-Band tunneling. For generating the Band-to Band tunneling, a voltage difference of around 10v between the cell transistor Tr and the gate electrode 107. To be specific, as sown in FIG. 12, the gate electrode 107 is set to +0.1v, the drain electrode (drain region 110) is set to +10v, the source electrode is set to open-state, the semiconductor substrate 101 or the well is set to the ground voltage (ov).

Consequently, the electron tunneling from the valence band to conduction band in the drain region 110 beneath the gate electrode 107 arises, therefore, the electron is generated. The electron thereof is changed to hot-electron-state to be a hot electron by the electric field within the depletion layer, and a part of the holes goes through the element isolating insulating film 105 (LI part of FIG. 3) to the silicon nitride film 120. As explained before, the information is written by charging the silicon nitride film 120 to minus by filling the electron into the silicon nitride film 120.

The electron reached to the silicon nitride 120 is held in the tarp level on the interface of the silicon nitride 120 or in the silicon nitride film 120, subsequently the position thereof can not be changed easily unless a erasing voltage is given from the outside, and then the silicon nitride film 120 is steadily being charged to minus.

Reading Operation:

The reading operation from the memory cell P is done using the apparent uprising of the threshold voltage of the nch cell transistor Tr caused by minus charging of the silicon nitride film 120 by the writing operation. That is, whether the information held in the cell transistor Tr is "0" or "1" is judged using the smaller drain current value of the threshold voltage of the cell transistor Tr of the silicon nitride film 120 charged to minus by the writing operation, compared with the threshold voltage of the cell transistor Tr of the silicon nitride film 120 not charged to minus because of no writing operation. To be specifically, whether the information held in the cell transistor Tr is "0" or "1" is judged by comparing the drain current read from the pch cell transistor Tr of the memory cell P with the threshold voltage of the cell transistor Tr of the memory cell P of the silicon nitride film 120 not charged to minus (that is, no writing).

In the case where the silicon nitride film 120 is charged to minus, the reason for the apparent uprising of the threshold voltage of the cell transistor Tr is that the minus electric field enters into the channel region (between the source region 109 and the drain region 110) in the vicinity of the silicon nitride film 120 and then the potential energy of the channel region falls. When the potential energy of the channel region falls, in the case of the nch cell transistor Tr, the potential energy becomes high as a carrier of the electron, then an inversion layer becomes more difficult to be generated, compared with the channel region of the silicon nitride film 120 not charged to minus, even when the same gate voltage is provided. Consequently, the threshold voltage of the cell transistor Tr of the silicon nitride film 120 filled with the electron becomes higher than the one of the silicon nitride film 120 not filled with the electron.

To be specifically, as shown in FIG. 12, the gate electrode 107 is set to +2.5v, the drain electrode is set to +2.5v, the source electrode is set to the ground voltage (0v), and the semiconductor substrate 101 or well is set to the ground voltage (0v). Consequently, a inversion layer is generated on the surface of the channel region, and the drain current flows between the drain region 110 and the source region 109. Whether the information is "0" or "1" is judged by comparing the detected drain current thereof with the drain current of the cell transistor Tr not receiving the writing operation.

Erasing Operation:

The information written in the memory cell P, that is the electron filled into the silicon nitride film 120 is erased by changing the cell transistor Tr back to the initial state by the electrical neutralization of filling the hole into the silicon nitride film 120 by generating the FN (Foweler-Norheim) tunnel current.

To be specific, as shown in FIG. 12, the gate electrode 107 is set to −12v, the drain electrode is set to the ground voltage (ov), the source electrode is set to the ground voltage (ov), the semiconductor substrate 101 or the well is set to the ground voltage (ov). Therefore, the FN tunnel current flows from the drain region 110 to the silicon nitride film 120, then the hole is filled into the silicon nitride film 120 and the silicon nitride film 120 is electrically neutralized.

A manufacturing method for a semiconductor device 1 will be described as below, referring to FIG. 5 and FIG. 9.

As shown in. FIG. 5(a), the silicon nitride film 103 is produced by forming a buffer oxide film 102 of silicon oxide film by thermally oxidizing the surface of a the semiconductor substrate 101 and by depositing the silicon nitride film on the buffer oxide film 102 by CVD (Chemical Vapor Deposition) method.

Subsequently, as shown in FIG. 5(b), a region except the region formed to be the element isolating region 1010B is covered with a resist film using the publicly-known photolithography technology, then the silicon nitride film 103 and the buffer oxide film 102 are removed using the above resist film as a mask. Continuously, a concavity 101a is formed on the semiconductor substrate 101 by removing the exposed surface of semiconductor substrate 101 to the depth of from 350 nm to 500 nm after removing the silicon nitride film 103 and the buffer oxide film 102 using the above resist film as a mask.

FIGS. 5(a) and (b) are views of the case of the memory cell array 1001, however, the formation and the removal of the buffer oxide 102 and the silicon oxide film 103; and the formation of the concavity 101a on the semiconductor substrate 101 are done around the peripheral circuit region in the same way as in the FIGS. 5(a) and (b).

Figure 6:
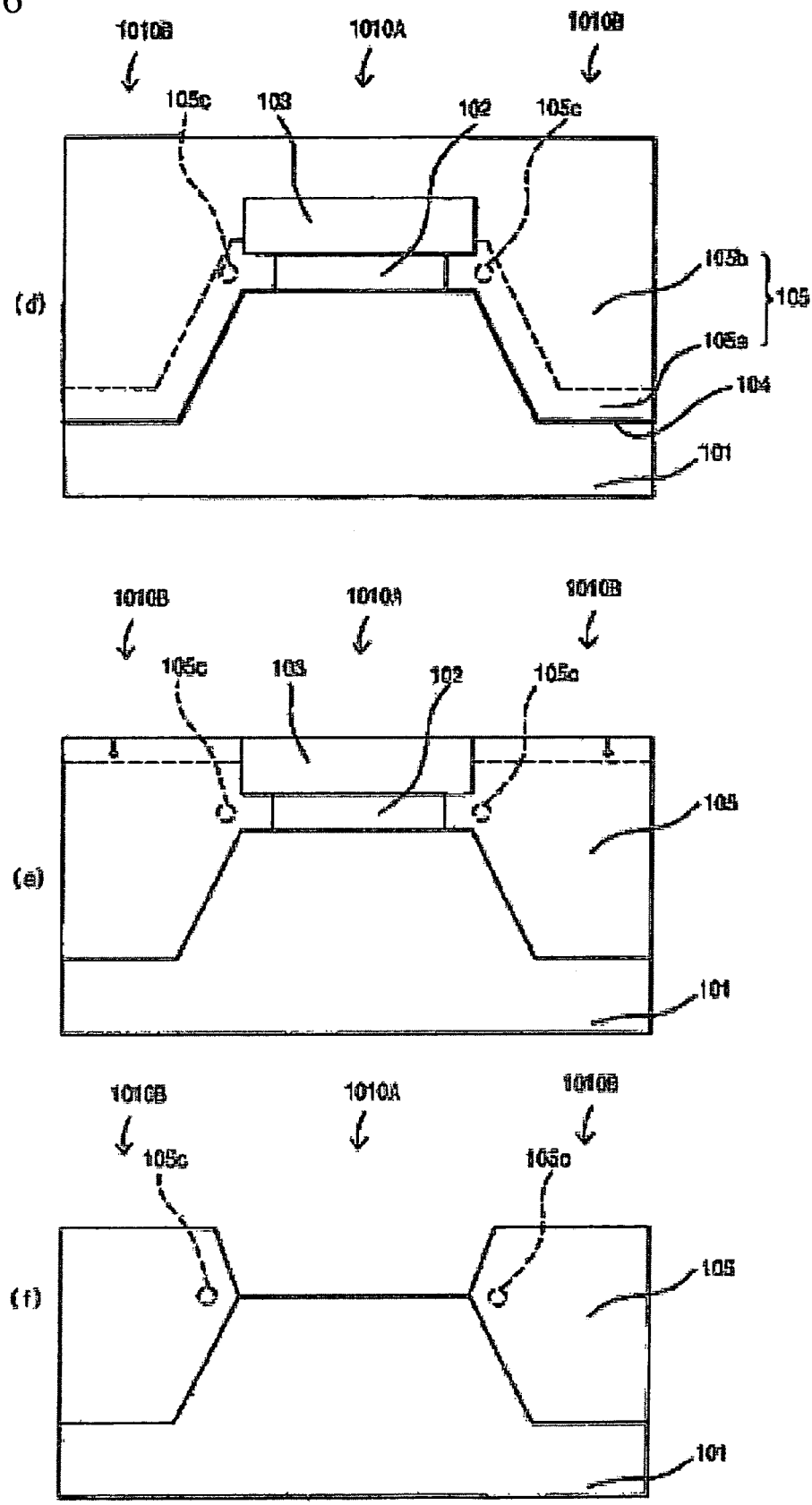
FIG. 6 A diagram showing a manufacturing process for a memory cell array of a semiconductor memory device in accordance with the present invention.

Subsequently, as shown in FIG. 5(c), the buffer oxide film 102 is thrust back to a point of from 5 nm to 20 nm away from the edge of silicon nitride film 103 by cleaning process using a solution including HF as a process before oxidization, or by wet etching process using a solution including HF besides from the above cleaning process. Consequently, the overhung structure of silicon nitride film 103 from the buffer oxide film 102 can be obtained. In the case where the process for thrusting the buffer oxide film 102 is done by cleaning, a HF solution having the concentration of from 0.3% to 1% is used for the cleaning solution. The buffer oxide film 102 is etched by a 1% HF solution at a rate of approximately 6 nm/minutes (proportional to the HF concentration). Subsequently, the cleaning time is determined out of consideration of the concentration of the HF solution, the film thickness of buffer oxide film 103 to be thrust back. At the same time, the thrusting process for the buffer oxide film 103 can be done by a wet etching process besides from the cleaning process. A 1% HF solution is used for the wet etching process. The process time of the wet etching is determined out of consideration of the thickness of the buffer oxide film 103, based on the etching process for the buffer oxide film 102 by 1% HF solution at the rate of approximately 6 nm/minute. As described before, after the buffer oxide film 102 is thrust back to form the overhung structure (overhang part 102a) of silicon nitride film 103 to the buffer oxide film 102, the lower density region 105c (refer to FIG. 6) is formed in the vicinity of the overhang part 102a when the element isolating insulating film 105 is formed. Subsequently, the silicon oxide film 104 is obtained by thermally oxidizing the exposed region of the semiconductor substrate 101, that is the concavity 101a in the element isolating region 1010B, using publicly known thermally-oxidization technology.

FIG. 5(c) is a view of the case of the memory cell array 1001, however, the removal of the buffer oxide 102 and the formation of the silicon oxide film 104 is done around the peripheral circuit region in the same way as in the FIG. 5(c).

Secondly, as shown in FIG. 6(d), the element isolating insulating film 105 is formed by forming the silicon oxide film using High Density Plasma Chemical Vapor Deposition (hereinafter refer to as "HD-CVD") method. Two-step process is done for forming the silicon oxide film. Specifically, the silicon oxide film is formed using the two-step process consisting of the first film forming step to form the silicon oxide film having coarse (low) density under the first condition, and the second film forming step to form the silicon oxide film having denser (higher) density than the silicon oxide film of the first film forming step under the second condition.

In the first film forming step, the silicon oxide film is formed at film forming of around 20 nm at the temperature of 300 degrees in centigrade as the first condition. In the following second step, the silicon oxide film is formed at the temperature of 650 degrees in centigrade to be the total film thickness of from 400 nm to 800 nm through the first and the second film forming steps. The temperature for forming film is controlled by adjusting the temperature in the chamber by applying, for example, backside helium. Specifically, in the first step, the wafer temperature thereof is lowered by applying backside helium to set the film forming temperature to 300 degrees in centigrade, and in the second step, the film forming temperature is set to 650 degrees in centigrade without backside helium.

Additionally, instead of the above mentioned first condition and the second condition, the first condition and the second condition can be set as below. In the first film forming step, PE-CVD (Plasma Enhanced-Chemical Vapor Deposition) method or AP-CVD (atmospheric Pressure-Chemical is used for forming the silicon oxide film of about 20 nm as the first condition, subsequently, in the second film forming step, HD-CVD is used for forming the silicon oxide film of the total film thickness of from 400 nm to 800 nm through the first and the second film forming step. Since the silicon oxide film formed by the CVD at atmospheric pressure, such as RE-CVD method or AP-CVD method, has a lower density compared with the silicon oxide film formed HD-CVD method, the silicon oxide film has a higher etching rate to HF solution.

As explained before, at the initial stage of the first film forming process, in the case of forming film at lowered temperature or by PE-CVD method or AP-CVD method, the initially formed silicon oxide film having the thickness of 20 nm has the lower density film. Furthermore, since the silicon oxide is more difficult to be deposited densely in the overhung part 102a having the overhung silicon nitride film 103 from the buffer oxide film 102, the film density in the overhung part 102a is easy to have a lower film density. Consequently, the lower density part 105c having a lower film density than other part thereof is formed in the overhung part 102a. The lower density part 105c is formed along the edges of the buffer oxide film 102 and the silicon nitride film 103. That is, the above lower density part 105c is formed along the boundary between the element forming region 1010A and the element isolating region 1010B. In FIG. 6(d), the silicon oxide film formed in the first film forming step is represented as 105a, and the silicon oxide film formed in the second film forming step is represented as 105b.

In the case of etching or wet etching the silicon oxide film by HF solution, the removal rate of the silicon oxide film by the HF solution depends on the film density of the silicon oxide film. For example, in FIG. 6(d), the thermally-oxidized film 104 has the densest film density (highest film density) having the lowest HF rate, and the HF rate using 5% HF solution of the thermally-oxidized film 104 is about 30 nm/minute. The HF rate of the silicon oxide film 105b except the lower density part 105c by HD-CVD is 1.5 times as high as the rate of the thermally-oxidized film and is about 45 nm/minute. On the contrary, the HF rate of the lower density part 105c becomes from 5 to 10 times as high as the rate of the thermally-oxidized film and is about from 150 to 300 nm/minute. In other words, according to the present embodiment, the film density of the lower density part 105c can be represented by the HF rate having a rate from 3.3 to 6.7 times as high as the HF rate of other denser parts.

FIG. 6(d) is a view of the case of the memory cell array 1001, however, the formation of the element isolating insulating film 105 is done around the peripheral circuit region in the same way as in the FIG. 6(d).

Secondly, as shown in FIG. 6(e), the element isolating insulating film 105 is polished by CMP (Chemical Mechanical Polishing) method for the planarization thereof. The polishing of the silicon oxide film by CMP method is done to the extent that the silicon nitride film 103 is exposed, using the silicon nitride film 103 as a stopper film. Subsequently, before the silicon nitride film 103 and the silicon oxide film 102 are removed, the removing process of the element isolating insulating film 105 by HF solution is done in order to adjust the relative height of the finally remaining element isolating insulating film 105 to the semiconductor substrate 101, in the element isolating region 1010B. In the above process, in the memory cell array 1001, the first part 1051 of the element isolating insulating film 105 is adjusted to vertically project about from 50 nm to 1500 nm over from the surface of semiconductor substrate 101 in the element forming region 1010A. Beyond FIG. 6(e), the thermally-oxidized film 104 is omitted in the drawings, because the thermally-oxidized film 104 is included in the element isolating insulating film 105.

Figure 10:
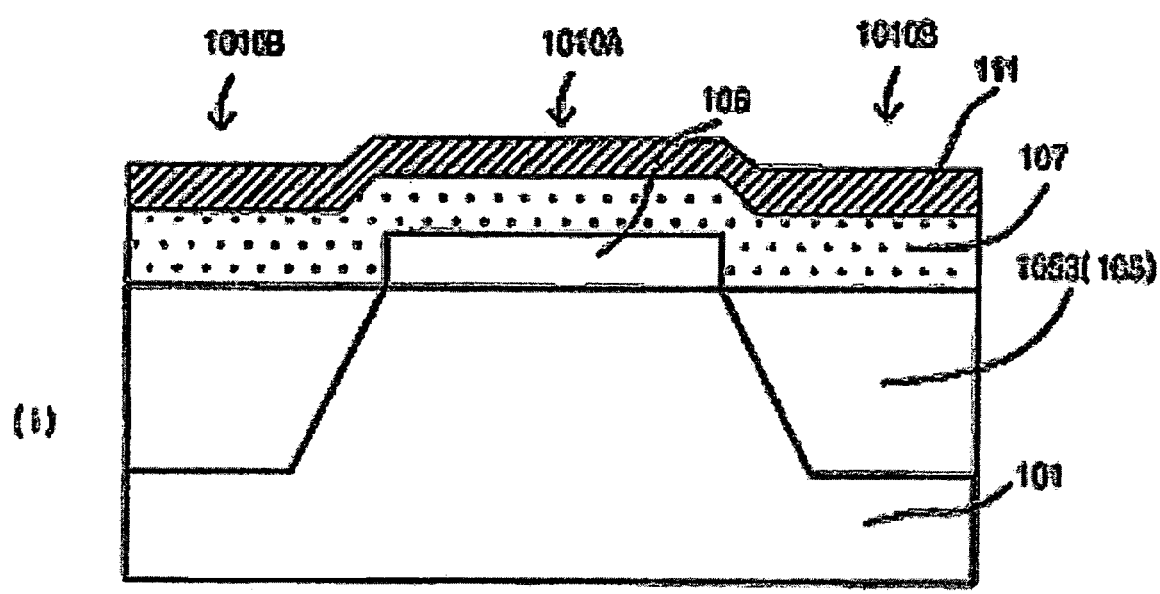
FIG. 10: A diagram showing a manufacturing process for a peripheral circuit region of a semiconductor memory device in accordance with the present invention.

FIG. 9 and FIG. 10 are diagrams showing a view of a manufacturing process in the region except the memory cell array 1001, that is, in the peripheral circuit region.

In the peripheral circuit, since the height of the element isolating insulating film 105 is preferable to be approximately the same as the surface of semiconductor substrate 101 in the element forming region 1010A, the element isolating insulating film 105 selectively is lowered using publicly-known photolithography and etching technology, as shown in FIG. 9(c). In FIG. 9(e), the element isolating insulating film 105 adjusted to be as high as the surface of semiconductor substrate 101 is shown as a third part 1053.

Secondly, as shown in FIG. 6(f) and FIG. 9(f), the silicon nitride film 103 and the buffer oxide film 102 are removed by publicly-known wet etching technology using solution including phosphoric acid.

Subsequently, after a well is formed in the element forming region 10101A of the semiconductor substrate 101 and the surface concentration adjustment is conducted for adjusting Vt of the transistor, the gate oxide film 106 having a thickness of from 4 nm to 15 nm is formed by publicly known thermally-oxidization technology, as shown in FIG. 7(g) and FIG. 9(g). Furthermore, the ploy silicon film 107 having thickness of around from 100 nm to 120 nm, using publicly known Low Pressure-Chemical Vapor Deposition (LP-CVD). In the case of n-type substrate used as a semiconductor substrate 101, the well of the p-type impurity diffused region is formed in order to form the p-type transistor on the surface of the n-type substrate and to form simultaneously the n-type transistor on the n-type substrate. On the contrary, in the case of p-type substrate used as a semiconductor substrate 101, the well of the n-type impurity diffused region is formed in order to form the n-type transistor on the surface of the p-type substrate and to form simultaneously the p-type transistor on the p-type substrate.

After formation of the poly silicon film 107, patterning of the poly silicon film 107 is done on the word line 131 combined with the gate electrode 107, using publicly known photolithography and etching technology. Furthermore, the gate insulating film 106 is removed to be thin during etching of the poly silicon 107, then all of the gate insulating film thereof is removed or some of the gate insulating film is remained at the cleaning process thereafter.

Subsequently, the impurity is injected into the element forming region 1010A of the semiconductor substrate 101 using publicly known photolithography technology and ion plantation technology to form the lower concentration defused region 109a, 110a and adjust the concentration of the lower concentration defused region 109a, 110a.

Figure 8:
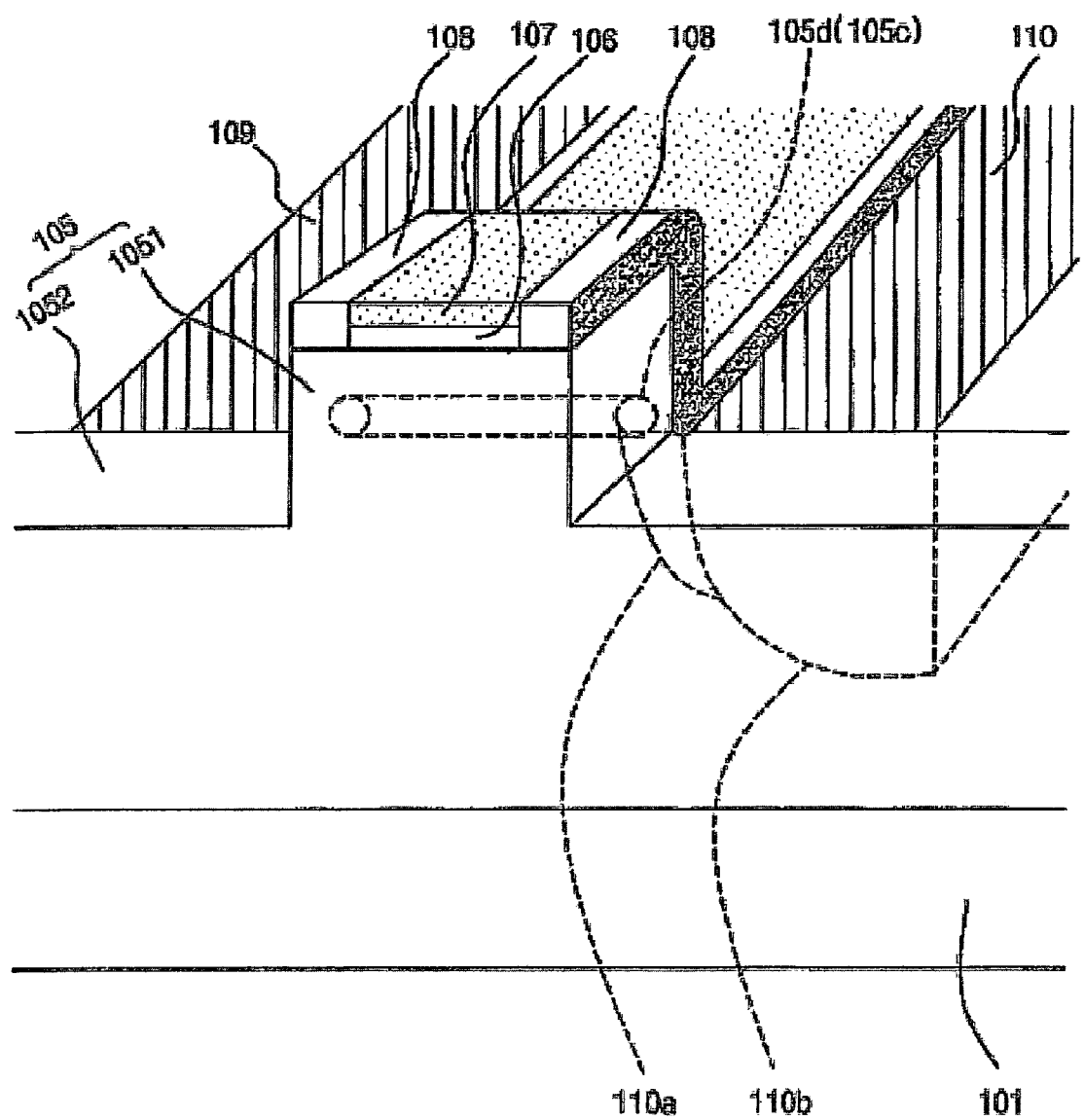
FIG. 8: A oblique perspective diagram showing a memory cell array of a semiconductor memory device in accordance with the present invention, wherein the part of memory cell array along the line of D-D' of FIG. 2 is cut off.

Subsequently, the silicon nitride film is formed by publicly-known LP^CVD method and then the sidewall 108 is formed on the side wall of the gate electrode 107 (word line 131) by etching back the silicon nitride film by publicly-known dry etching technology. The above dry etching is done to the extent that the surface of semiconductor substrate 101 becomes exposed in the element forming region 1010A, and the part not covered with the gate electrode 107 (word line 131) is lowered to the approximately same height as the surface of semiconductor substrate 101, in the element isolating region 1010B, as shown in FIG. 8. Consequently, as shown in FIG. 8, the side face of the first part 1051 covered with the gate electrode 107 (word line 131) becomes exposed to both of the source region 109 side and the drain region 110 side, in the element isolating region 1010B, as shown in FIG. 8. The part of the element isolating insulating film 105 not covered with gate electrode 107 (word line 131) becomes the second part 1052 having a lower height than the first part 1051.

According to the present embodiment, the silicon nitride film 107 is taken an example of material for the sidewall 108, however, a silicon oxide film or poly silicon, etc. can be applicable thereto. Nevertheless, at the subsequent process, since the element isolating insulating film 105 is etched using the gate electrode 107 (word line 131) and the sidewall 108 as a mask, it is preferable that the material of the sidewall 108 has an etching selective ratio to the material of the element isolating insulating film 105. Consequently, in the case where the element isolating film 105 is formed by the silicon oxide film, it is preferable that the sidewall 108 is formed with the silicon nitride film or the poly silicon. On the contrary, it is preferable that the sidewall 108 is formed by a silicon oxide film or a poly silicon in the case where the element isolating insulating film 105 is formed by a silicon nitride film.

Subsequently, the protective film 112 of silicon oxide film is formed in the thickness of 10 nm in the whole area thereof by publicly known LPCVD method for surface protection and channeling prevention at the next process of ion plantation, as shown in FIG. 7(h). Furthermore, an ion plantation is done through the protective film 112 by publicly known photolithography and etching technology, using the gate electrode 107 (word line 131) and the sidewall 108 as the mask. The higher concentration region 109a, 110b are formed on the both sides of the gate electrode 107 (word line 131) and the sidewall 108 by the above process. Consequently, a shown in FIG. 8, the source region 109 of the lower concentration diffusion region 109a and higher concentration diffusion region 109b is formed, and the drain region 110 of the lower concentration diffusion region 110a and higher concentration diffusion region 110b.

Subsequently, except the region unacceptable to lower the poly resistance or the diffusion resistance, for example, the ESD transistor forming region or the analog circuit forming region, the protective film 112 is etched so as to expose the gate electrode 107, the source region 109 and the drain region 110, etc. in the element forming region 110A, using photolithography and etching technology. The above etching is conducted using 1% HF solution for approximately 90 seconds. Then, the protective film deposited on the side face of the source side and the drain side of the first part 1051 in the element isolating insulating film 105 is removed by etching using HF solution, and the lower density part 105c in the side face of the source side and the drain side becomes exposed.

As explained before, since the HF rate of the lower density part 105c is large than other parts of the side face of the source side and the drain side of the first part 1051, the HF solution more rapidly is infiltrated into the lower density part 105c than other parts thereof because of the film density difference of the element isolating insulating film 105 (silicon oxide film), when the lower density 105c is exposed to the side face of the source side and the drain side of the first part 1051. Additionally, the HF solution rapidly erode the part not covered with the element isolating insulating film 105 removed part of is removed part by capillary phenomenon, and then the hole 105d going through from the side face of the source side to the side face of the drain side is formed mainly in the lower density part 105c of the first part 1051, as shown FIG. 7(h) and FIG. 8. The hole 105d is a vacancy of pipe having a diameter of less than 0.05 um.

The HF solution wet etching rate of the silicon oxide film depends strongly on the film density of the silicon oxide film. In other words, the part having a coarse (low) film density of the silicon oxide film is etched at higher rate than the part having a dense (high) film density thereof. Since the element isolating insulating film 105 has a configuration consisting of the lower density part 105c surrounded by the higher density silicon oxide film, the diameter of the hole 105 can be controlled with high controllability, by infiltrating rapidly lower density part 105c by the HF solution from the different etching rate of the HF solution and by eroding additionally the silicon oxide film by the HF solution by capillary phenomenon. At the above process stage, in the peripheral circuit region, since the height thereof is lowered by removing the element isolating insulating film 105, the local lower density part 105c does not accordingly exists by removing. Consequently, in the peripheral circuit region, the hole 105d is not formed in the element isolating insulating film 105.

When the part covered with the gate electrode 107 (word line 131) and the sidewall 108 of the element isolating insulating film 105 is represented by a first part 1051, and the part not covered with the gate electrode 107 (word line 131) and the sidewall 108 of the element isolating insulating film 105 is represented by a second part 1052, the first part 1051 is higher than the second part 1052.

In the above case, the bole 105d is formed in the process for etching the protective film of the silicon oxide film by the HF solution, however, the hole 105d can be formed in the subsequent cleaning process or the subsequent wet etching process being done before the process for forming the stopper film by the silicon nitride film.

Subsequently, a sillicide film of CoSi, or TiSi, etc. is formed only in the region having the exposed silicon surface, by forming a high-melting-point metal of Co, or Ti, etc. on the surface of the source region 109 and the drain region 110 using publicly known. suputtering technology, and by the subsequent heat terating. In the above process, since Co, or Ti, etc is remained to be Co, or Ti, etc. because of no sillicidation thereof, Ti, or Co, etc. therein is easy to be removed by the subsequent cleaning using alkaline solution, therefore CoSi is remained only on the silicon thereof.

Subsequently, in prior to the following process for forming the silicon nitride, the whole area thereof is scrubbed using the HF solution, or is wet-etched by the HF solution independently from the before mentioned cleaning. In the case where the bole 105d is not formed by the prior etching process of the protective film 112, the hole 105d is formed in the above process. In the above process, the hole 105d of a pine vacancy having a diameter of less than 0.05 um is formed in the element isolating film 105, as shown in FIG. 7(h) and FIG. 8, as described below. With the help of the film density difference of the element isolating insulating film 105, the HF solution is rapidly infiltrated into the local lower density part 105c exposed to the side face of the first part 1051, and the silicon oxide film is rapidly eroded by the HF solution with the help of capillary phenomenon.

The HF solution wet etching rate of the silicon oxide film depends strongly on the film density of the silicon oxide film. In other words, the part having a coarse (low) film density of the silicon oxide film is etched at higher rate than the part having a dense (high) film density thereof. Since the element isolating insulating film 105 has a configuration consisting of the lower density part 105c surrounded by the higher density silicon oxide film, the diameter of the hole 105 can be controlled with high controllability, by infiltrating rapidly lower density part 105c by the HF solution from the different etching rate of the HF solution and by eroding additionally the silicon oxide film by the HF solution by capillary phenomenon. At the above process stage, in the peripheral circuit region, since the height thereof is lowered by removing the element isolating insulating film 105, the local lower density part 105c does not accordingly exists by removing. Consequently, in the peripheral circuit region, the hole 105d is not formed in the element isolating insulating film 105.

In the case where the above process is conducted by cleaning, HF solution having a concentration of from 0.3% to 1% is used as a cleaning liquid. The silicon oxide film is etched by the 1% HF solution at the rate of 6 nm/minute around. Consequently, the cleaning time is determined by consideration of the concentration of the HF solution and the length of the lower density part from the side face of the source side to the side face of the drain side in the first part 1051. Furthermore, the process thereof can be done by a wet etching process independent from the cleaning process. HF solution having a concentration of around 1% is used for the above wet etching process. The wet etching process time is determined by consideration of the length of the lower density part from the side face of the source side to the side face of the drain side in the first part 1051, based on the etching of the silicon oxide film by 1% HF solution at the rate of 6 nm/minute (proportional to the concentration of HF solution).

Subsequently, the silicon nitride film 111 having a function of stopper film during the formation of a contact hole for the formation of the upper wiring layer, is deposited by LP-CVD method, as shown FIG. 7(i) and FIG. 9(i). At the process thereof, since the hole 105d of vacancy is formed in the first part 1051 of the element isolating insulating film 105, silicon nitride film is deposited in the hole 105d and the silicon nitride film 120 of pipe is accordingly formed in the hole 105d.

After the aforementioned process, a normal wiring process is done and then the whole process is finished. The interlayer insulating film is formed on the silicon nitride film 111, and the contact hole is formed by removing the interlayer film on the gate electrode 107, the source region 109, and the drain region 110 by publicly known photolithography and etching technology. In the case of the process thereof, since the silicon nitride film 111 exists under the interlayer film, the silicon nitride film 111 has a function of a stopper film for the etching thereof. Furthermore, the gate electrode 107, the source region 109, and the drain region 110 is exposed by removing the silicon nitride film 111 on the gate electrode 107, the source region 109, and the drain region 110, and then the wiring layer connected with each contact thereof is produced on the interlayer insulating film by forming the contact in the gate electrode 107, the source region 109, and the drain region 110, respectively.

Effect of the Invention:

According to the present invention, the additional necessary process for composing the structure of the nonvolatile memory during the formation of the nonvolatile memory is only the photolithography process and the etching process for lowering the height of the element isolating insulating film 105 of the peripheral circuit region. Moreover, the wet etching process can form the necessary structure. Consequently, the process for forming the charge storage part structure can be added to the normal CMOS process at very low cost.

Furthermore, since the silicon nitride film 120 having a charge storage function is conventionally formed by a micro fabricating technology such as photolithography and etching technology, the minimum pattern size thereof is specified by the minimum size corresponding to the generation of the using technology. The physical limitation of the above minimum pattern size is around 0.3 um in the case of I-beam (wave length of 365 nm) used for stepper, and is around 0.15 um in the case of KrF laser (wave length of 256 nm). According to the present invention, the silicon nitride film 120 is not formed by a micro fabricating technology such as photolithography and etching technology, and the hole 105d is formed using the film density difference and a capillary phenomenon, therefore, the silicon nitride film 120 can be microfabricated independently from the generation of the micro fabrication technology. The formed pipe-shaped silicon nitride film 120 having a charge storage function according to the present invention has been observed to have a diameter of less than 0.05 um.

OTHER EMBODIMENTS

Additionally, in the above mentioned case, the lower density part 105c is exposed to the side face of the first part 1051 at the etching back process of the sidewall 108, however, the element isolating insulating film 105 can be etched to the extent that the lower density 105c is partially or mostly exposed when the sidewall 108 is etched back. In the case hereof, the lower density part 105c can be exposed during patterning the protective film 112, or cleaning or wet etching prior to forming the stopper film (silicon nitride film 111). For example, the lower density part 105c can be exposed during patterning the protective film 112 and the hole 105d can be formed during cleaning or wet etching prior to forming the stopper film (silicon nitride film 111), or the lower density part 105c can be exposed and the hole 105d can be formed during cleaning or wet etching prior to forming the stopper film (silicon nitride film 111).

According to the above mentioned embodiment, the silicon nitride film 120 of the charge storage part is formed to have a shape of bar going through from the side face of source side to the drain side of the first part 1051 of the element isolating insulating film 105, as shown in FIG. 2. However, a further modification can be done corresponding to multi-valued logic circuits, as below.

Figure 13:
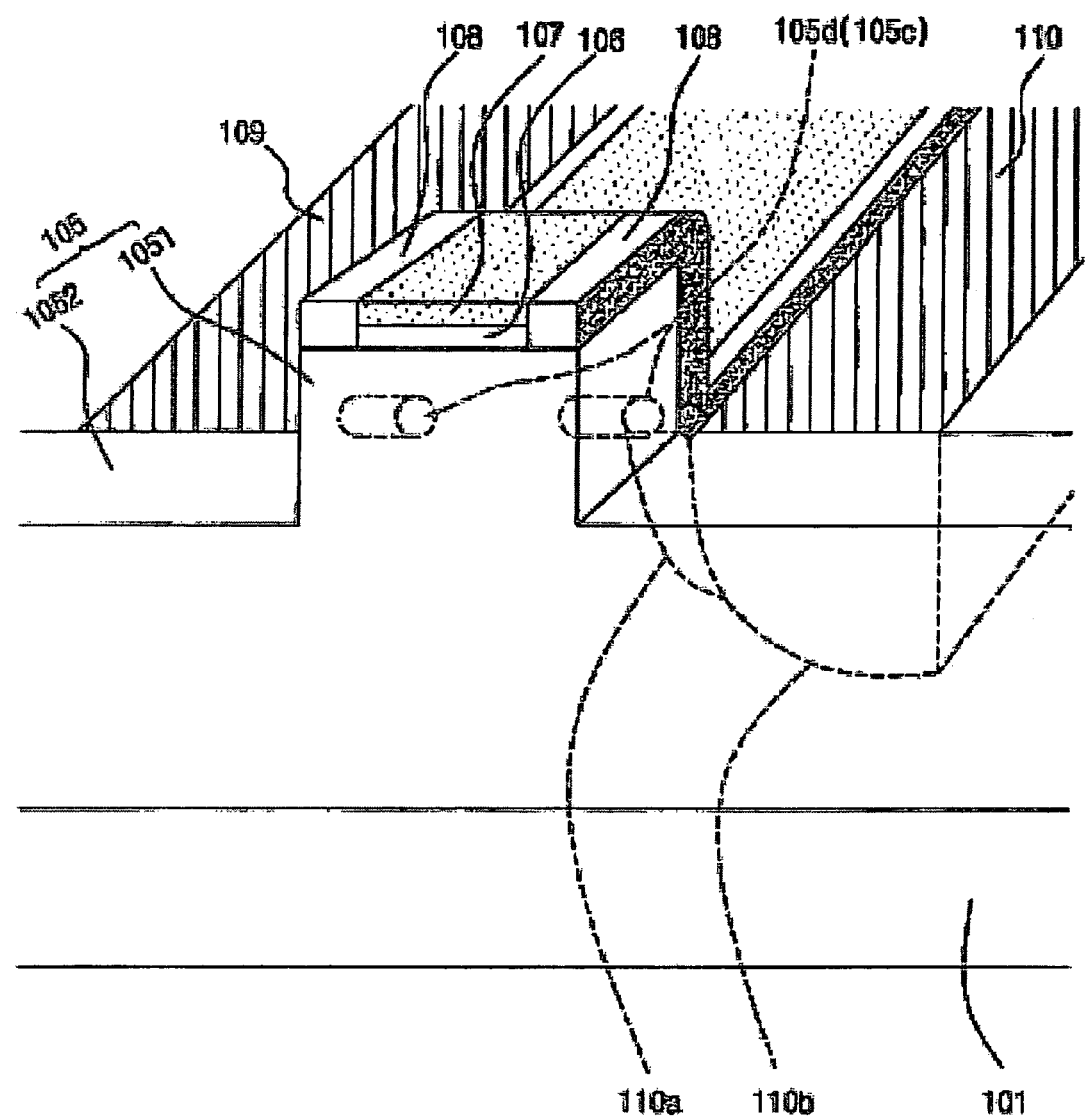
FIG. 13: A oblique perspective diagram showing a memory cell array of a semiconductor memory device in accordance with the modification of the present invention, wherein the part of memory cell array along the line of D-D' of FIG. 2 is cut off.
Figure 14:
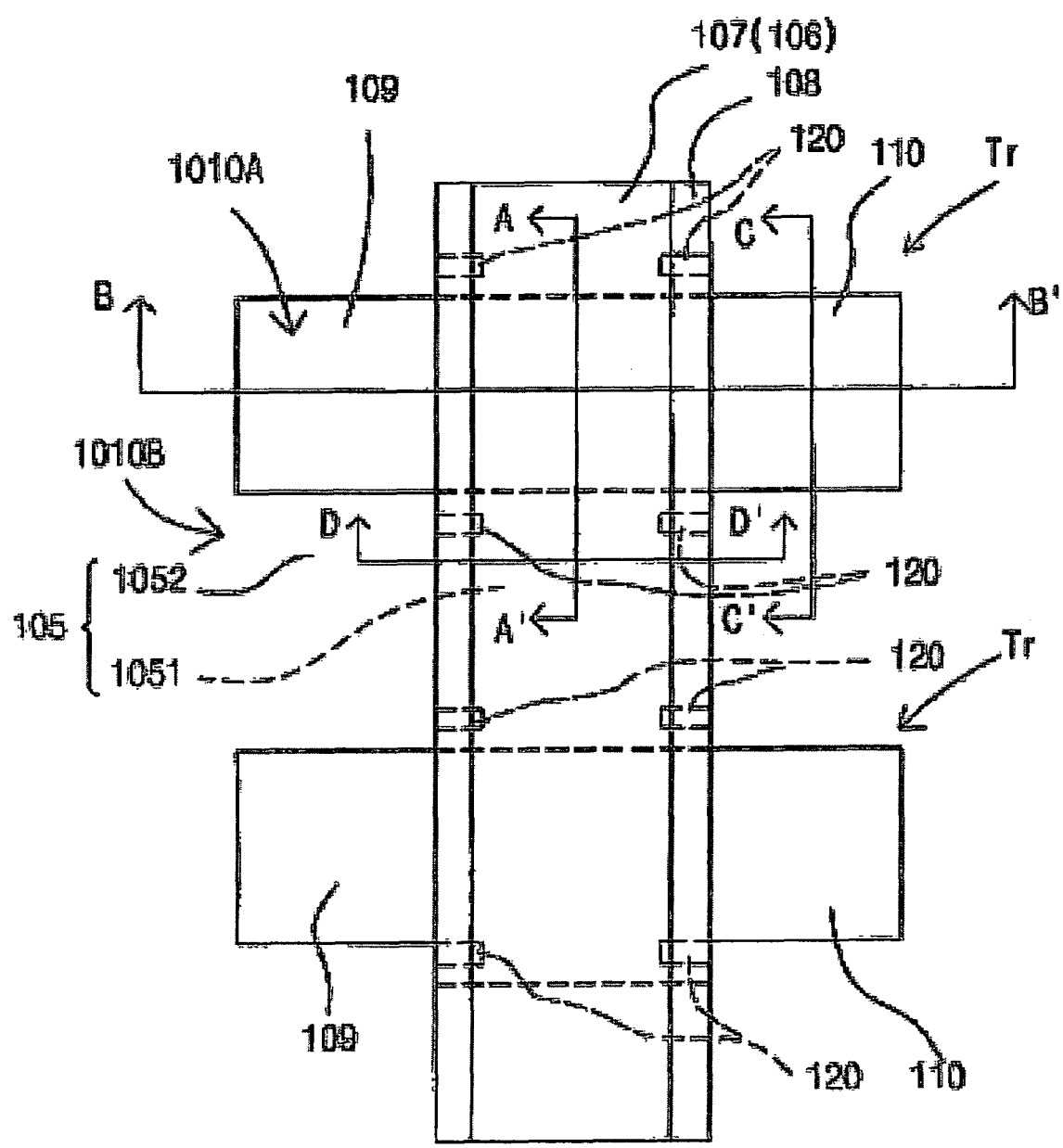
FIG. 14: A top-view diagram of an extracted part from a memory cell array of a semiconductor memory device in accordance with the modification of the present invention.

FIG. 13, FIG. 14 are views of explanatory diagrams of the semiconductor device in accordance with the modification of the present embodiment. FIG. 13 is a view of cross section diagram of the corresponding part to FIG. 8, and FIG. 14 is a view of top-view diagram of the corresponding part to FIG. 2 of the explanatory diagram of the aforementioned embodiment. In FIG. 13, FIG. 14, the element identical to the one in FIG. 8, FIG. 2 is provided with same numeral.

As shown in FIG. 13, FIG. 14, the silicon nitride film 120 of the charge storage part is divided to the first storage part and the second storage part. That is, the first storage part is formed along the side face of the source side of the first part 1051 of the element isolating insulating film 105, and the second storage part is formed along the side face of the drain side of the first part 1051 of the element isolating insulating film 105. According to the above configuration thereof, four of silicon nitride films 120 can be formed in one cell transistor Tr. As explained before, multi-valued data can be held by a plural of charge storage parts formed therein.

The above modification of the manufacturing method for semiconductor memory device will be explained a below. The manufacturing method per se is mostly the same as in FIG.

5-FIG. 7(h). That is, the process through the formation of the protective film 112 shown in FIG. 5-FIG. 7(h) is the same as in the case of the before mentioned embodiment. The modification can be obtained by controlling the etching time in the etching process of the protective film 112 shown in FIG. 7(h). As explained before, the hole 105d is formed by infiltrating into the lower density part 105c by the HF solution. The etching of the lower density part 105c by the HF solution infiltrating is processed at the same rate on both side faces of source and drain side, simultaneously. Therefore, it is preferable that the etching is halted before the hole formed by etching from the side face of the drain side is connected to the hole formed by etching from the side face of the source side. Consequently, the vacant-pipe shaped hole of a diameter of less than 0.05 um can be formed in the side face of the drain side and the source side, respectively. It is preferable that the length of the above vacant hole is longer than the width of the sidewall region (0.1 um) and is less than one third of the gate region length (0.08 um corresponding to the gate poly silicon width of 0.24 um), in other words, the distance from the edge of the poly silicon is less than one third thereof. The process after forming the vacant hole can be conducted in the same way as in the case of the before mentioned embodiment.

As described before, the semiconductor memory device having the structure according to the above modification of the embodiment can be produced by the same process as in the embodiment except controlling the etching time of the protective film 112.

What is claimed is:

1. A semiconductor memory device comprising;
   a semiconductor substrate being configured to include an element forming region and an element isolating region;
   a first insulating film being formed in said element isolating region to have a function of a element isolating insulating film;
   a first diffusion region and a second diffusion region being formed in said element forming region of said semiconductor substrate;
   a gate insulating film being formed between said first and second diffusion regions in said element forming region of said semiconductor substrate;
   a gate electrode being formed on said gate insulating film; and
   a charge storage part being formed in said first insulating film,
   wherein said first insulating film includes a first part being formed to have a projected shape from a surface of said semiconductor substrate of said element forming region and a second part being formed to have a lower height than said first part, and said charge storage part is formed in said first part.

2. The semiconductor memory device according to claim 1, wherein said gate electrode is hung over said first insulating film, said first part is formed in the part being covered with said gate electrode, and said second part is formed in the part not being covered with said gate electrode.

3. The semiconductor memory device according to claim 1, wherein said first part is formed to have a side face of said first diffusion region side and a side face of said second diffusion region, and said charge storage part is formed from said side face of said first diffusion region side to said side face of said second diffusion region.

4. The semiconductor memory device according to claim 1, wherein said first part is formed to have said side face of said first diffusion region side and said side face of said second diffusion region, and said charge storage part is formed to have a first storage part being formed along said side face of said first diffusion region and a second storage part being formed along said side face of said second diffusion region.

5. The semiconductor memory device according to claim 1, wherein a second insulating film is formed to have a function of a stopper film during forming a contact hole in said second part, and
   said charge storage part is formed with the same material as said second insulating film.

6. The semiconductor memory device according to claim 1, wherein said charge storage part is formed to in said side part of said gate insulating film to have the approximately same height.

7. The semiconductor memory device according to claim 1, wherein a part of said charge storage part is overlapped with said first diffusion region and said second diffusion region in the direction from said first diffusion region to said second diffusion region.

8. The semiconductor memory device according to claim 1, wherein a sidewall is formed in both of the sidewall of said gate insulating film and the sidewall of said gate electrode, and a part of said charge storage part is overlapped with said first and second diffusion regions in the direction from said first diffusion region to said second diffusion region.

9. The semiconductor memory device according to claim 1, wherein said charge storage part is formed in both sides of said gate insulating film.

10. The semiconductor memory device according to claim 1, wherein said semiconductor substrate includes a peripheral circuit region being formed by a memory cell array region and CMOS circuits, said element forming region and said element isolating region are included in both of said memory cell region and said peripheral circuit region, respectively, and said element isolating insulating film of said peripheral circuit region is formed to have the approximately height as the surface of said semiconductor substrate in said element forming region.

11. The semiconductor memory device according to claim 2, wherein said first part is formed to have a side face of said first diffusion region side and a side face of said second diffusion region, and said charge storage part is formed from said side face of said first diffusion region side to said side face of said second diffusion region.

12. The semiconductor memory device according to claim 2, wherein said first part is formed to have said side face of said first diffusion region side and said side face of said second diffusion region, and said charge storage part is formed to have a first storage part being formed along said side face of said first diffusion region and a second storage part being formed along said side face of said second diffusion region.

* * * * *